United States Patent [19]
Gal et al.

[11] Patent Number: 5,420,720
[45] Date of Patent: May 30, 1995

[54] INTERNALLY COOLED LARGE APERTURE MICROLENS ARRAY WITH MONOLITHICALLY INTEGRATED MICROSCANNER

[75] Inventors: George Gal, Palo Alto; Howard E. Morrow, San Jose, both of Calif.

[73] Assignee: Lockheed Missiles & Space Company, Inc., Sunnyvale, Calif.

[21] Appl. No.: 11,323

[22] Filed: Jan. 29, 1993

Related U.S. Application Data

[63] Continuation-in-part of Ser. No. 904,316, Jun. 25, 1992, and Ser. No. 982,514, Nov. 27, 1992, Pat. No. 5,310,623.

[51] Int. Cl.⁶ .................. G02B 27/10; G02B 23/00
[52] U.S. Cl. ......................... 359/622; 359/619; 359/621; 359/626
[58] Field of Search ............. 359/619, 621, 622, 626

[56] References Cited

U.S. PATENT DOCUMENTS

| | | | |
|---|---|---|---|
| 3,421,805 | 1/1969 | Rowland | 359/622 |
| 4,861,140 | 8/1989 | Lucitte et al. | 350/320 |
| 5,098,184 | 3/1992 | van der Brandt et al. | 359/622 X |
| 5,136,164 | 8/1992 | Hendrick, Jr. | 250/353 |
| 5,139,609 | 8/1992 | Fields et al. | 156/643 |
| 5,270,859 | 12/1993 | Wirth et al. | 359/622 |

OTHER PUBLICATIONS

William Goltsos & Michael Holz "Agile Beam Steering Using Binary Optics Microlens Arrays" Nov. 1990, *Optical Engineering*, vol. 29 No. 11.

G. Artzner "Aspherical surfaces engraved on photoresist coatings: manufacture of a zonal corrector plate for an aberrating cassegrainian telescope", 1987, *Optical Components and Systems*, SPIE vol. 805.

*Primary Examiner*—Do Hyun Yoo
*Attorney, Agent, or Firm*—Donald C. Feix

[57] ABSTRACT

A large aperture microlens array assembly has at least two arrays of microlenses with individual unit cell trains optically interconnecting individual microlenses in one array with related individual microlenses in another array. In each unit cell train the light entering an entrance pupil of a microlens in one array is transmitted through the exit surface of a related microlens of the other array to provide a collimated output through the exit. One array may be moved with respect to the other array for scanning a field of regard.

32 Claims, 18 Drawing Sheets

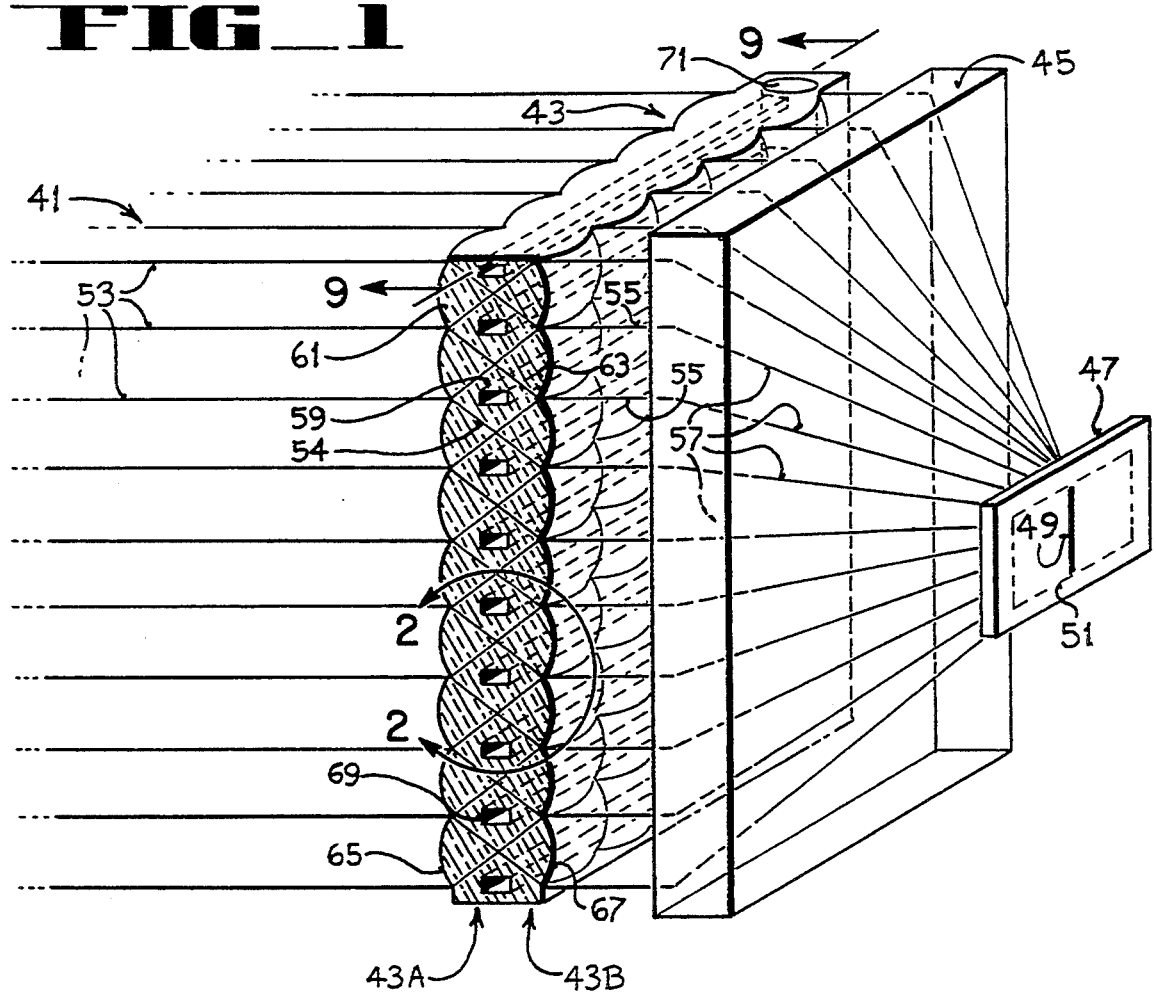
FIG_1
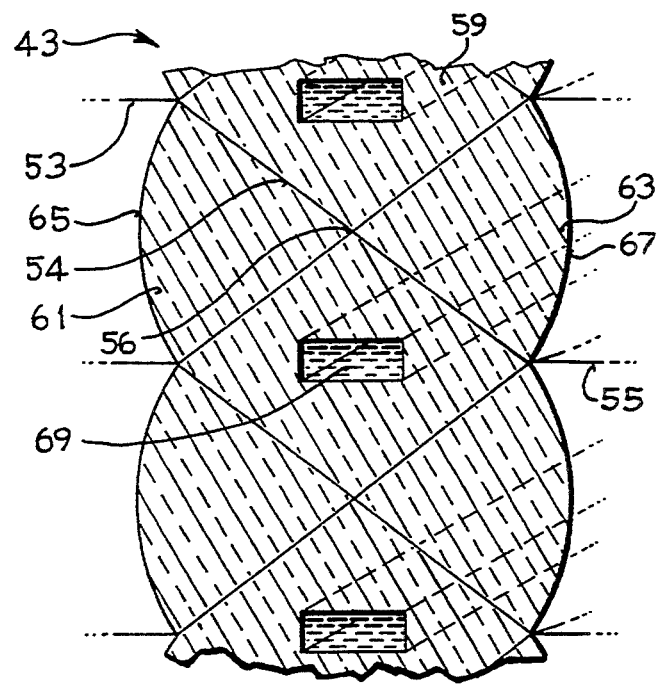
FIG_2

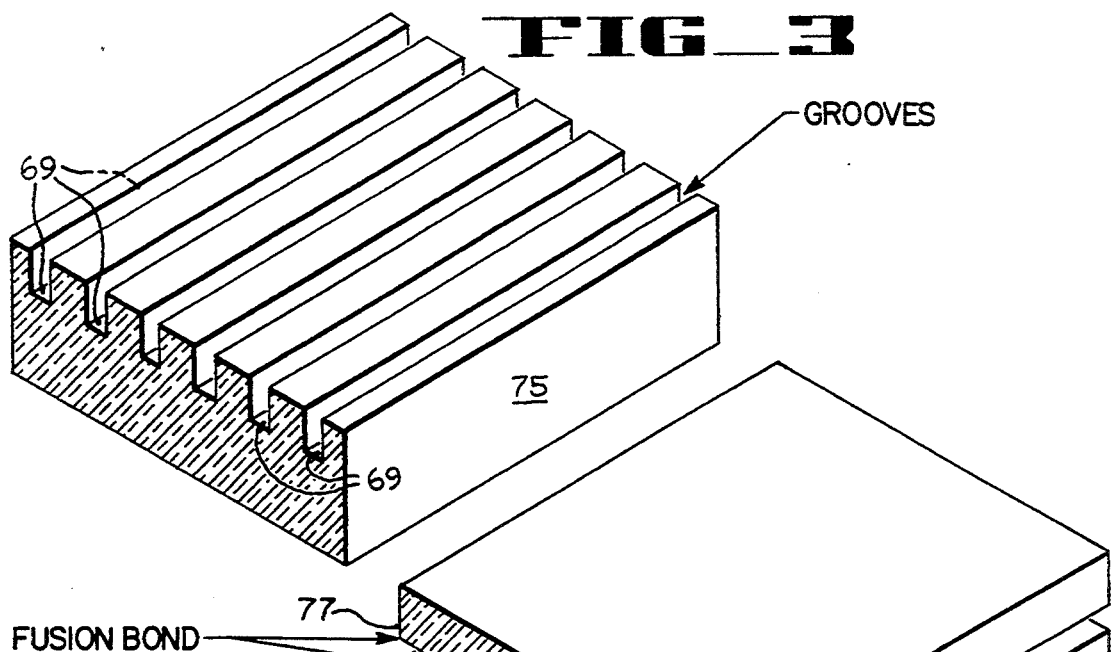
FIG_3
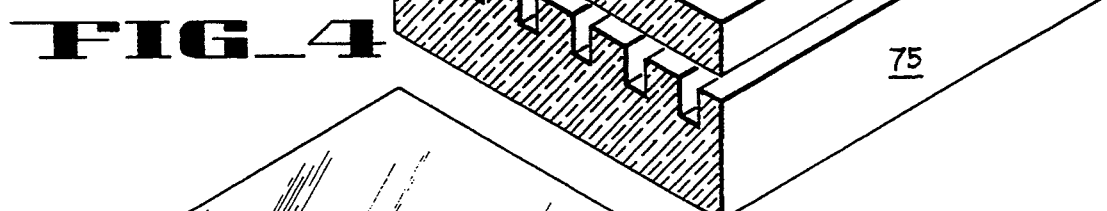
FIG_4
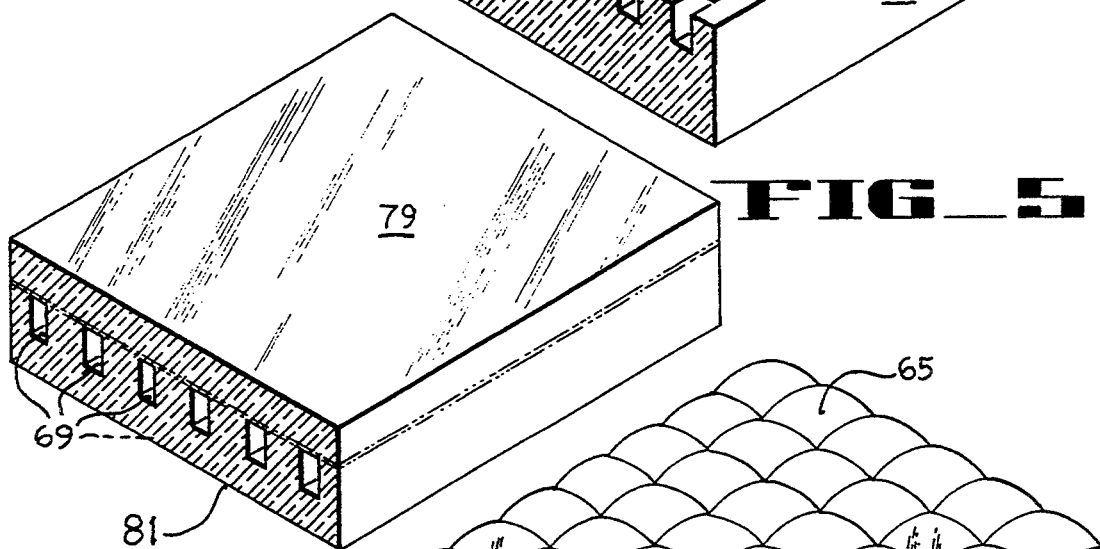
FIG_5
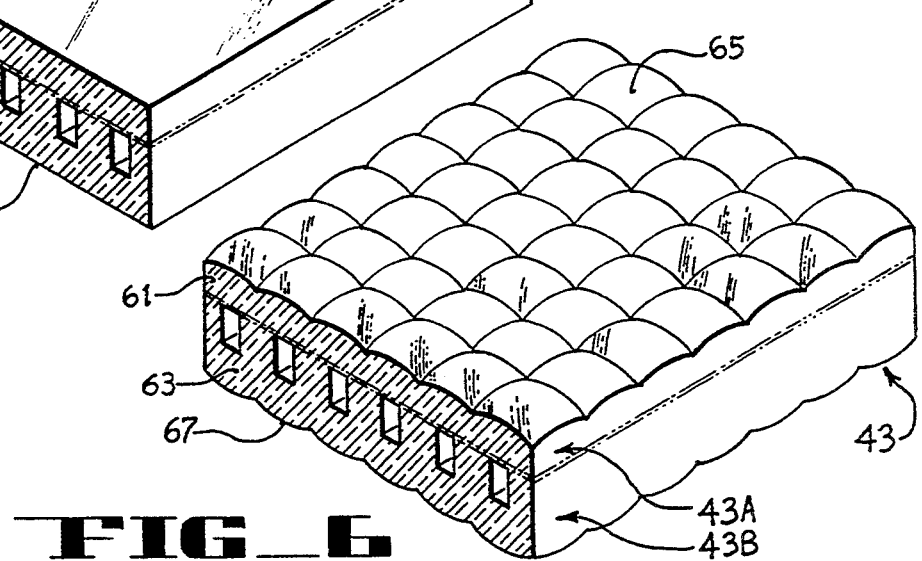
FIG_6

FIG_7
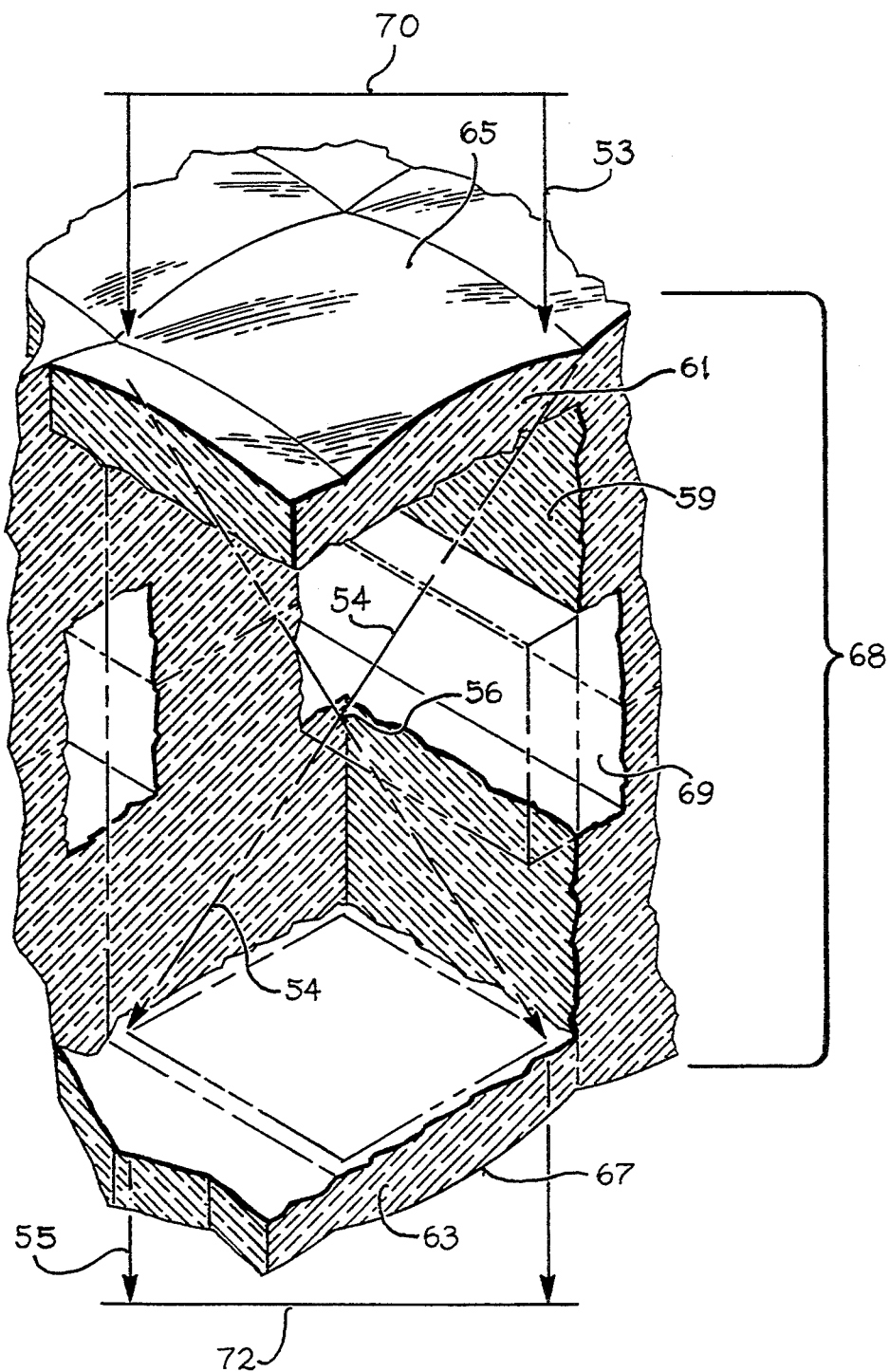

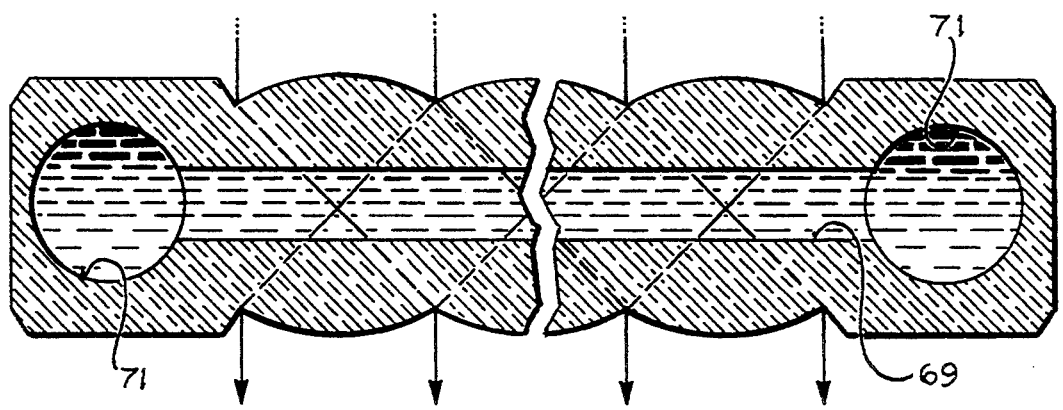
FIG_8
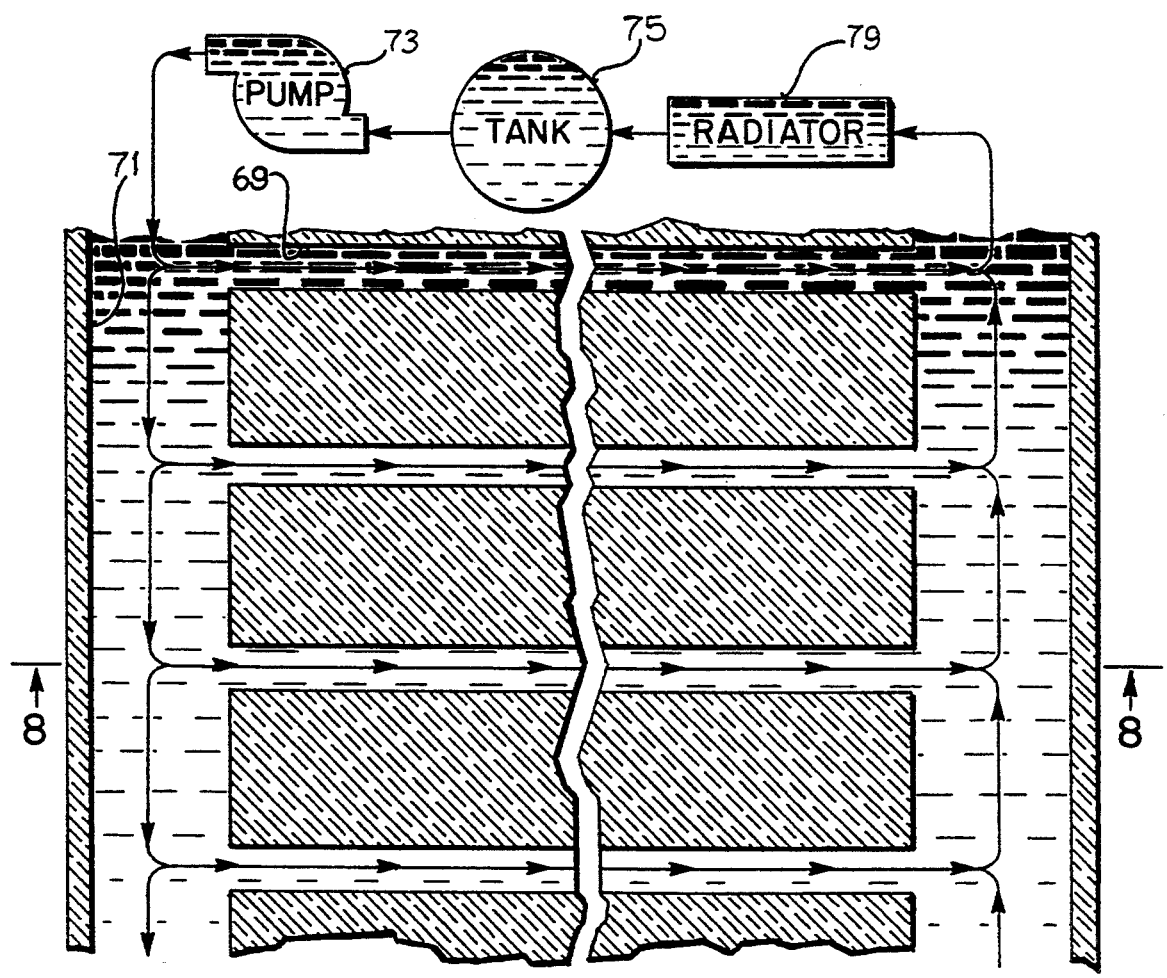
FIG_9

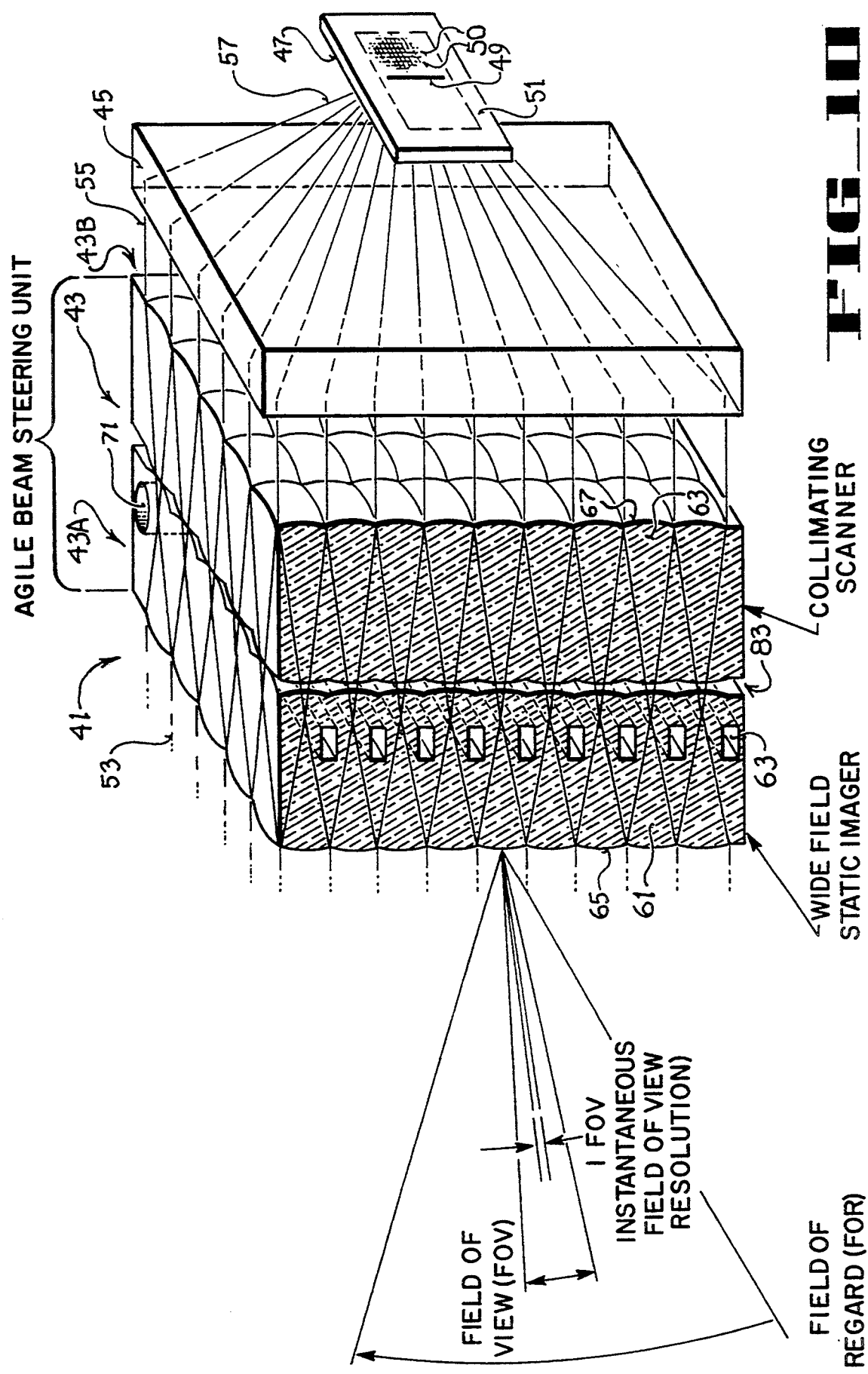
FIG_11

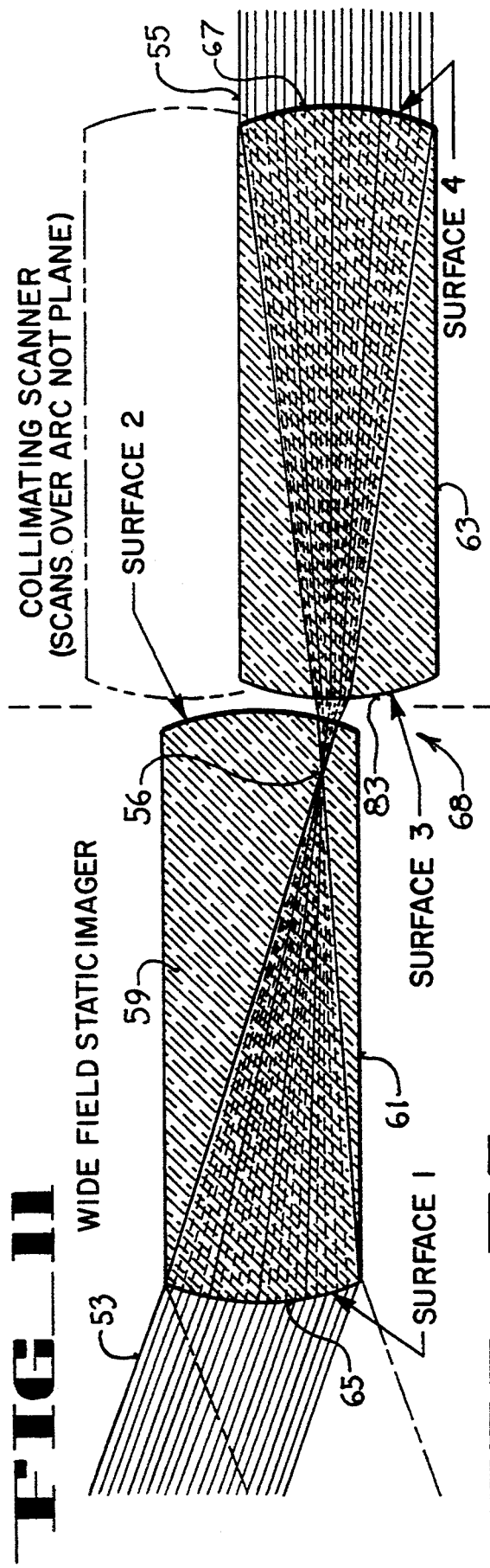
FIG_11
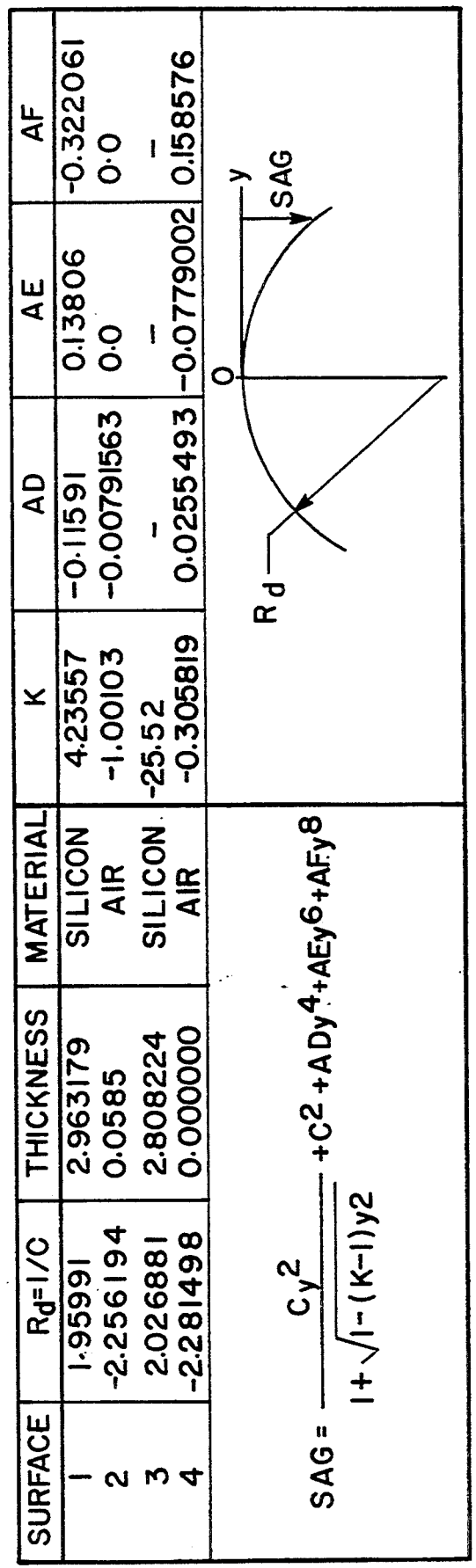
FIG_34

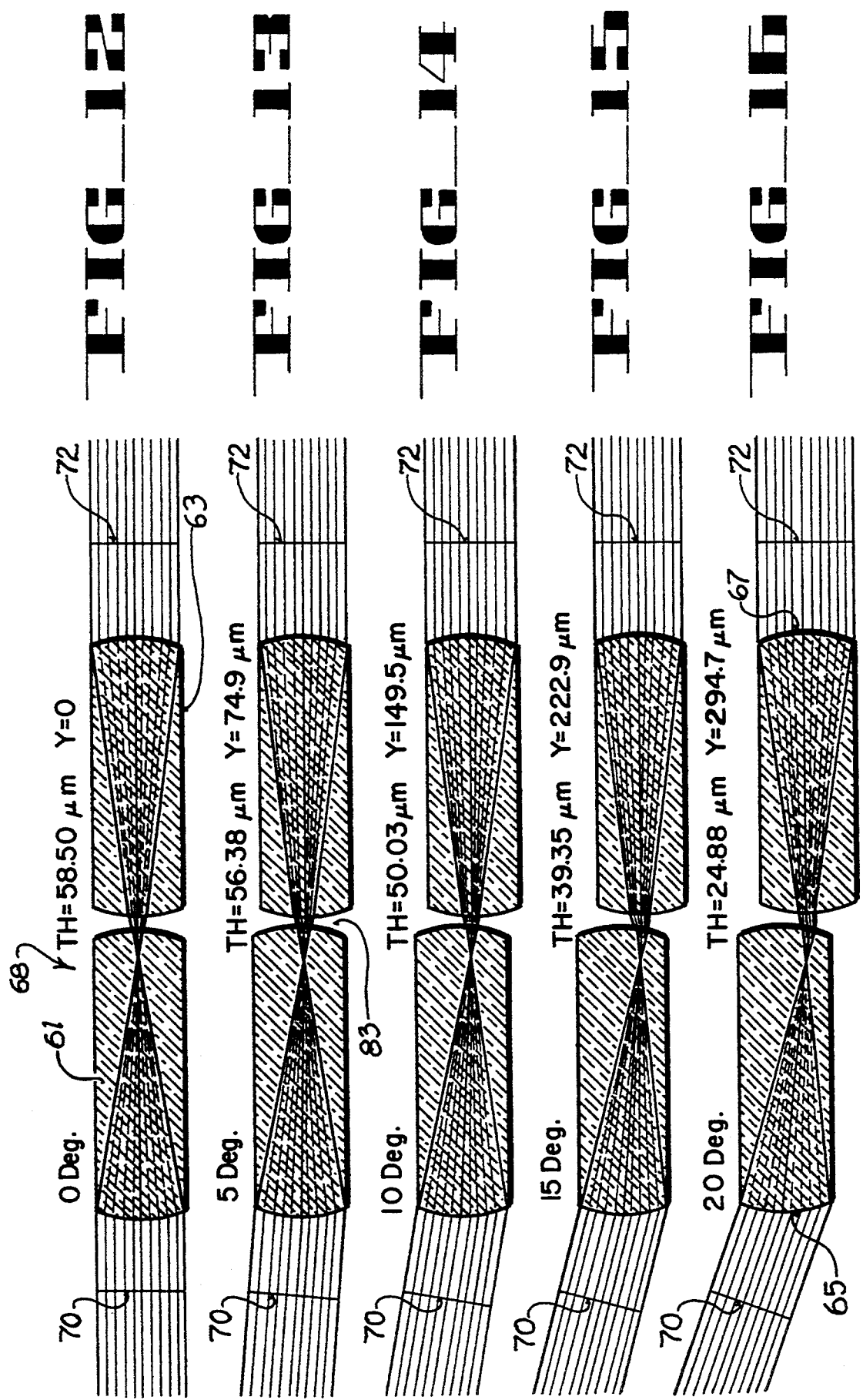

FIG_17
UNITS ARE MILLIMETERS
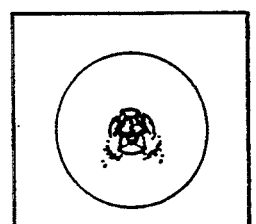 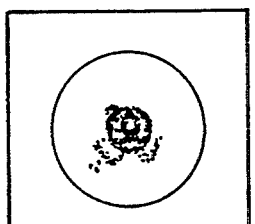 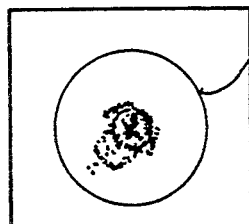 −2 Deg.
RMS: 0.0662   RMS: 0.0672   RMS: 0.0711
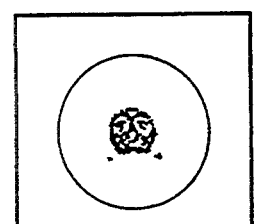 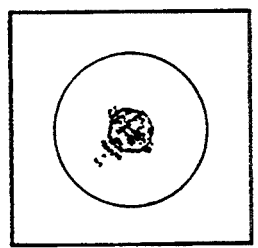 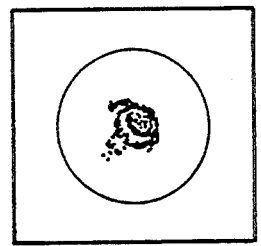 −1 Deg.
RMS: 0.0638   RMS: 0.0645   RMS: 0.0672
ON AXIS
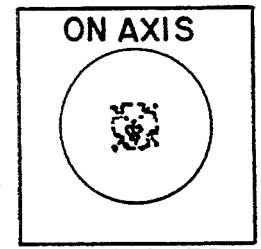 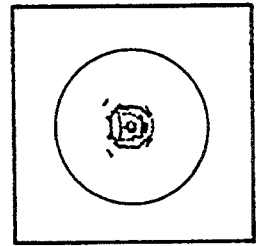 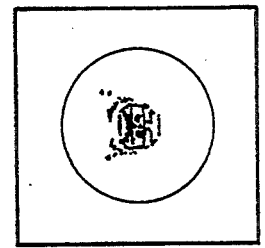 0 Deg.   ALONG SCAN
RMS: 0.0632   RMS: 0.0638   RMS: 0.0662
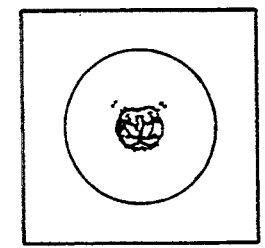 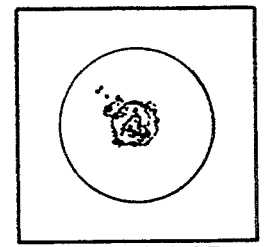 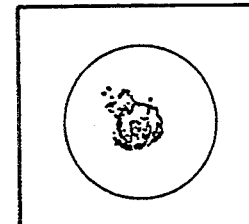 +1 Deg.
RMS: 0.0638   RMS: 0.0645   RMS: 0.0672
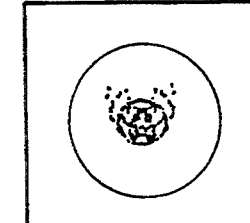 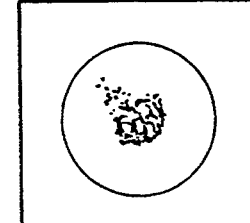 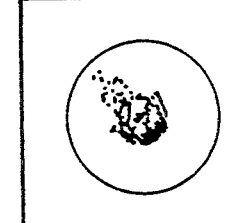 +2 Deg.
RMS: 0.0662   RMS: 0.0672   RMS: 0.0711
0 Deg.   1 Deg.   2 Deg.
ACROSS SCAN ⟶
BLUR SPOT  0 Deg. FOV

FIG_18
UNITS ARE MILLIMETERS
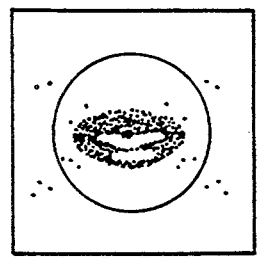 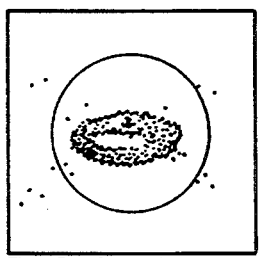 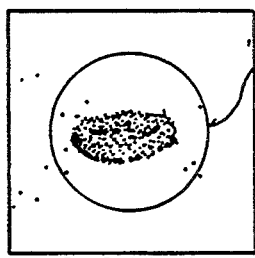 −2 Deg.
RMS: 0.1596   RMS: 0.1579   RMS: 0.1530
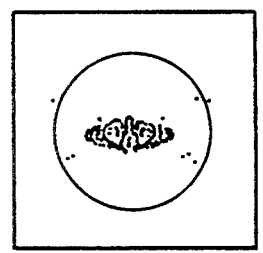 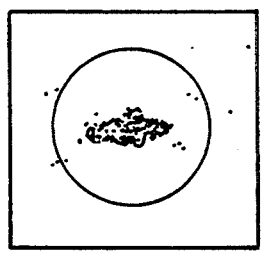 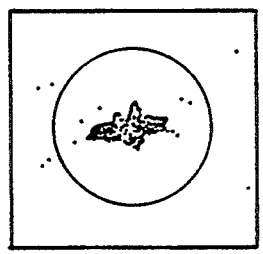 −1 Deg.
RMS: 0.1133   RMS: 0.1126   RMS: 0.1108
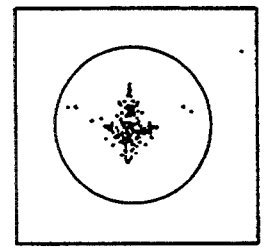 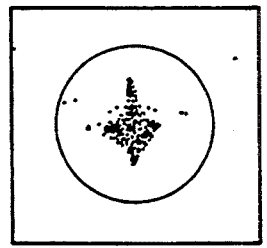 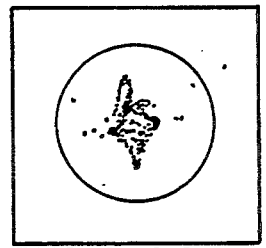 0 Deg. ALONG SCAN
RMS: 0.0961   RMS: 0.0973   RMS: 0.1012
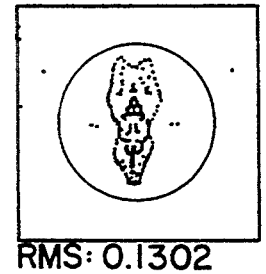 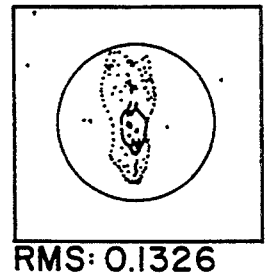 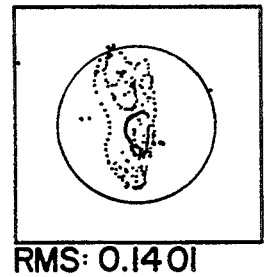 +1 Deg.
RMS: 0.1302   RMS: 0.1326   RMS: 0.1401
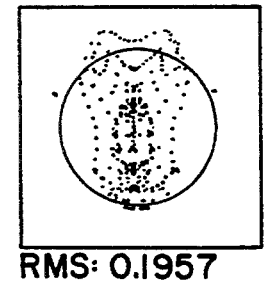 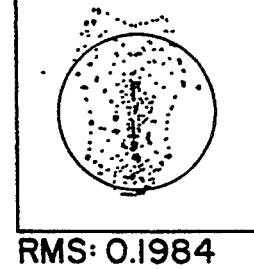 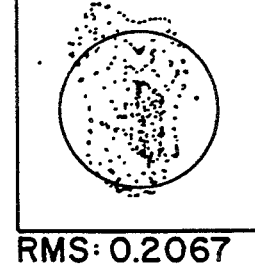 +2 Deg.
RMS: 0.1957   RMS: 0.1984   RMS: 0.2067
0 Deg.        1 Deg.        2 Deg.
ACOSS SCAN ⟶
BLUR SPOT 20 Deg. FOV

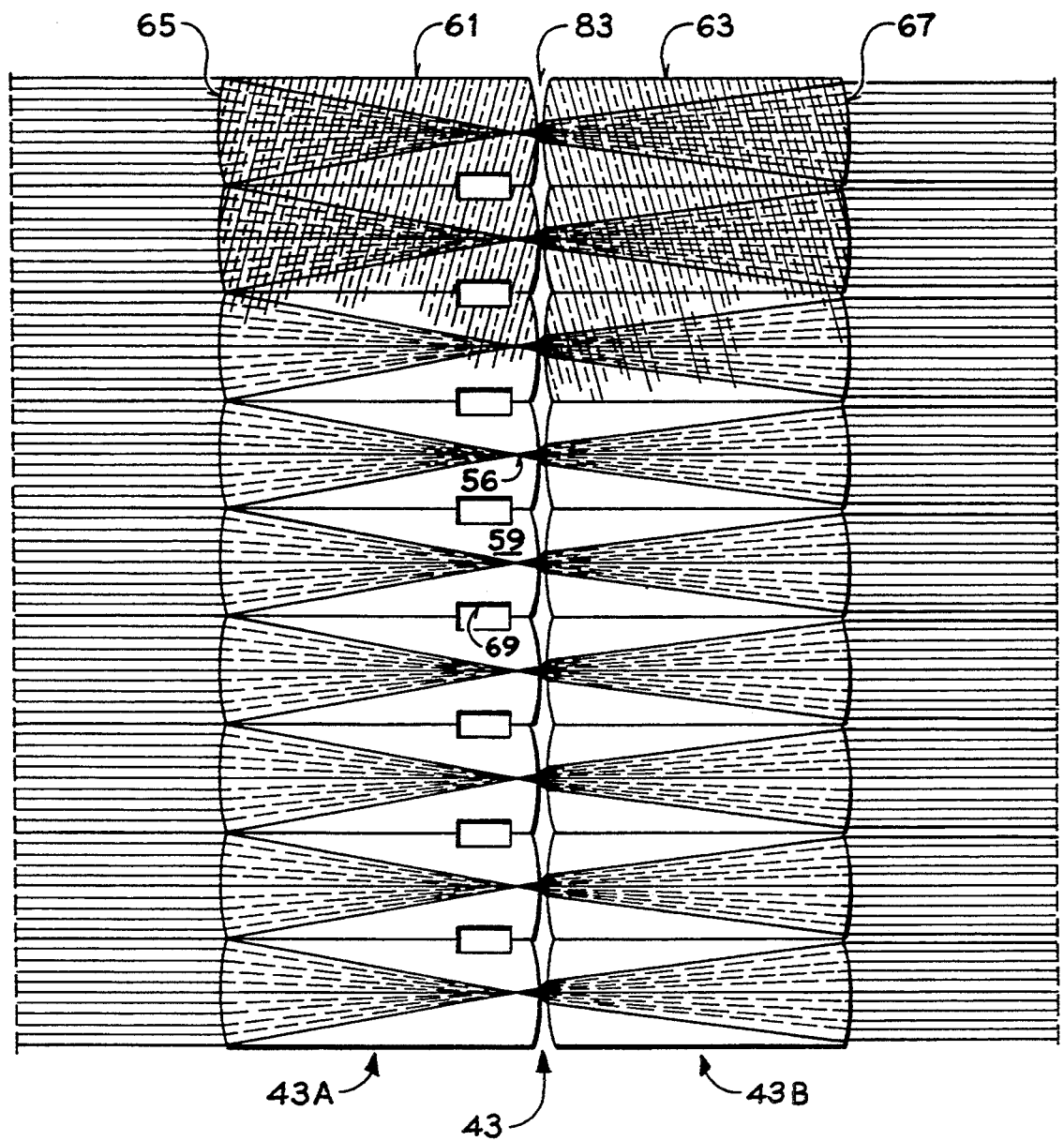
FIG_19
ARRAY CROSS-SECTION FOR 0-deg SCAN

FIG_20
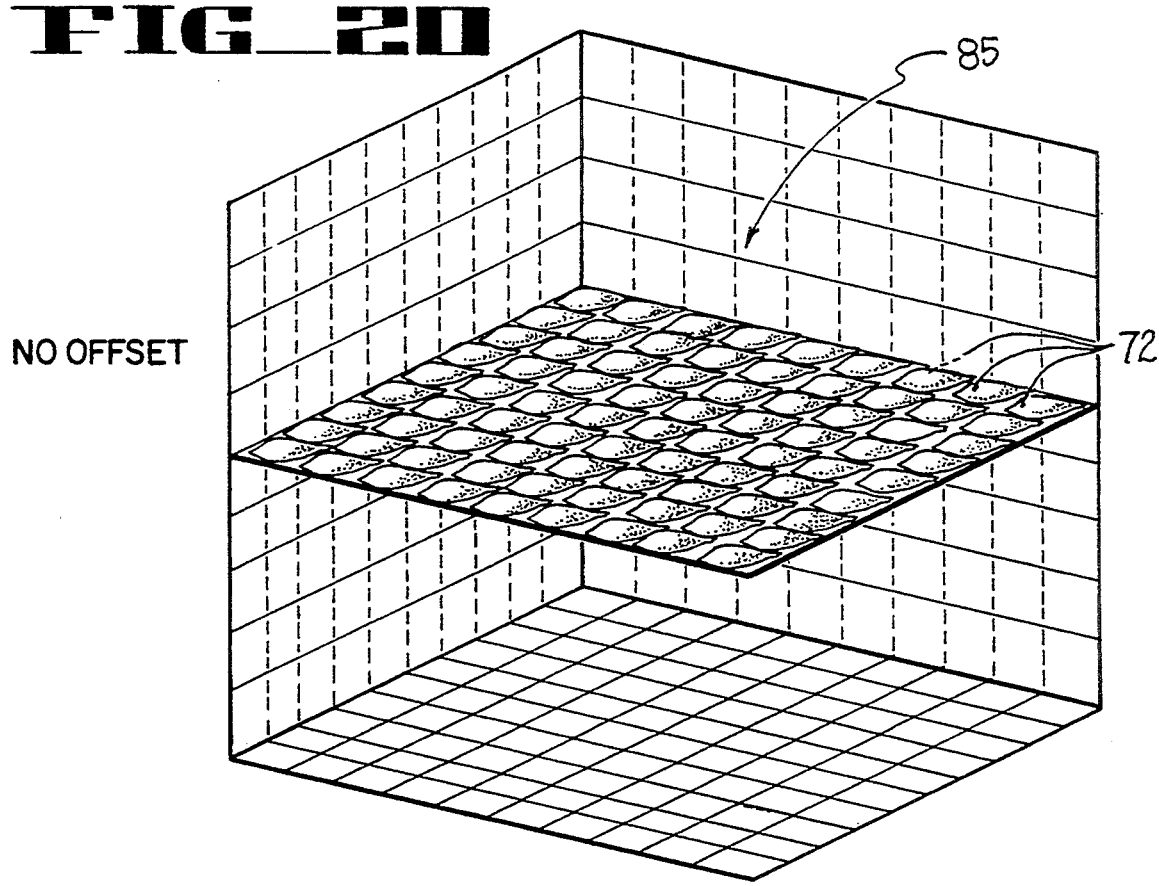
NO OFFSET
FIG_21
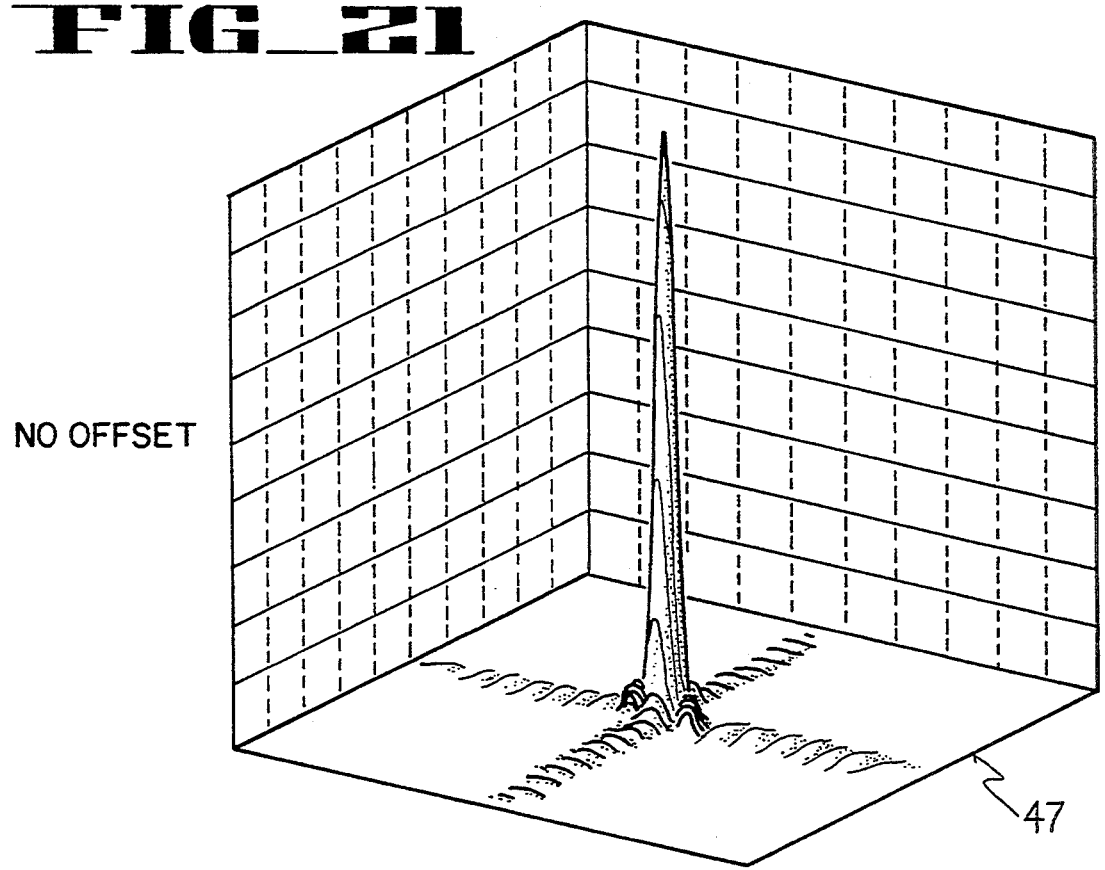
NO OFFSET

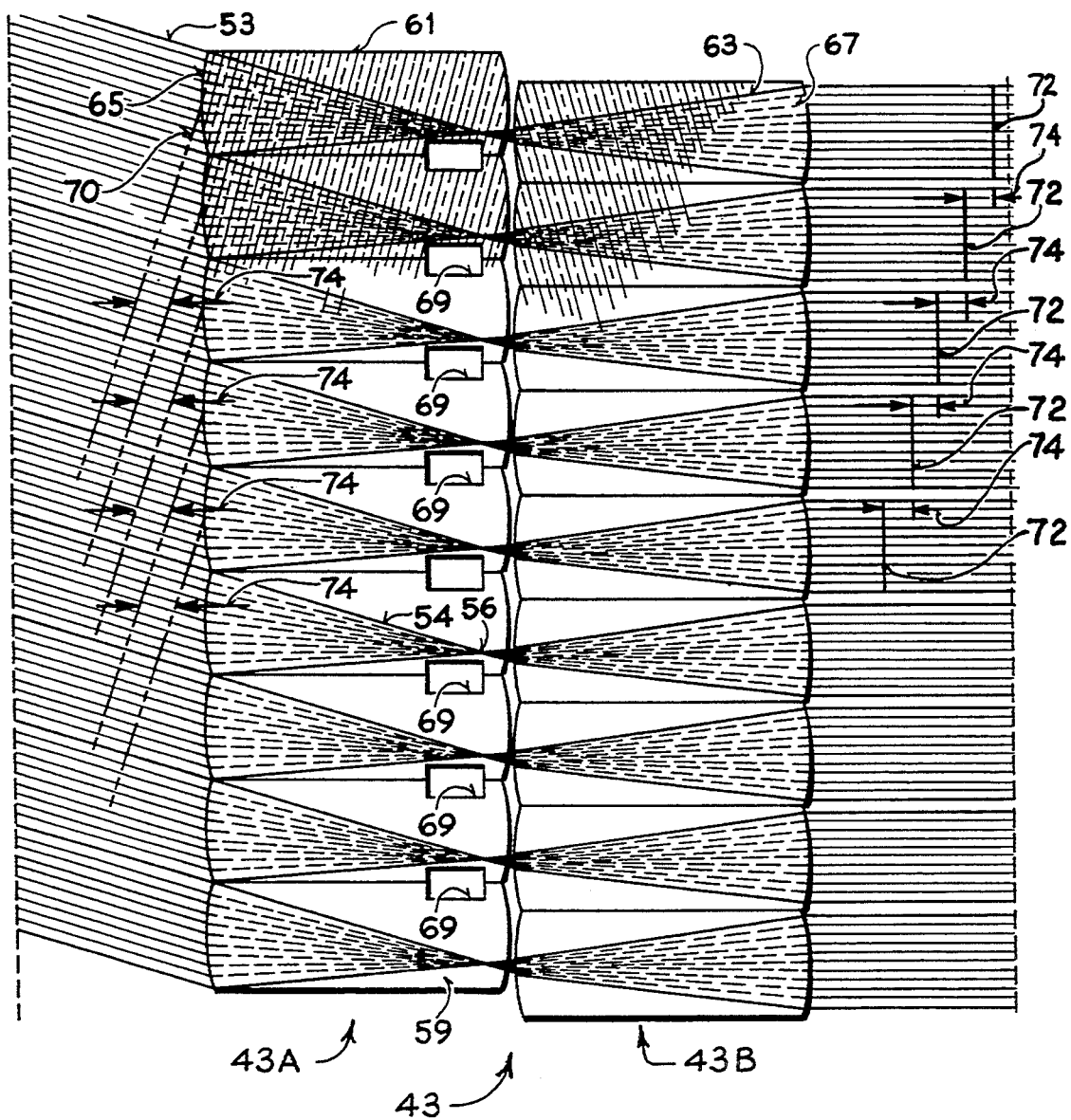
FIG_22
ARRAY CROSS-SECTION FOR 20-deg SCAN

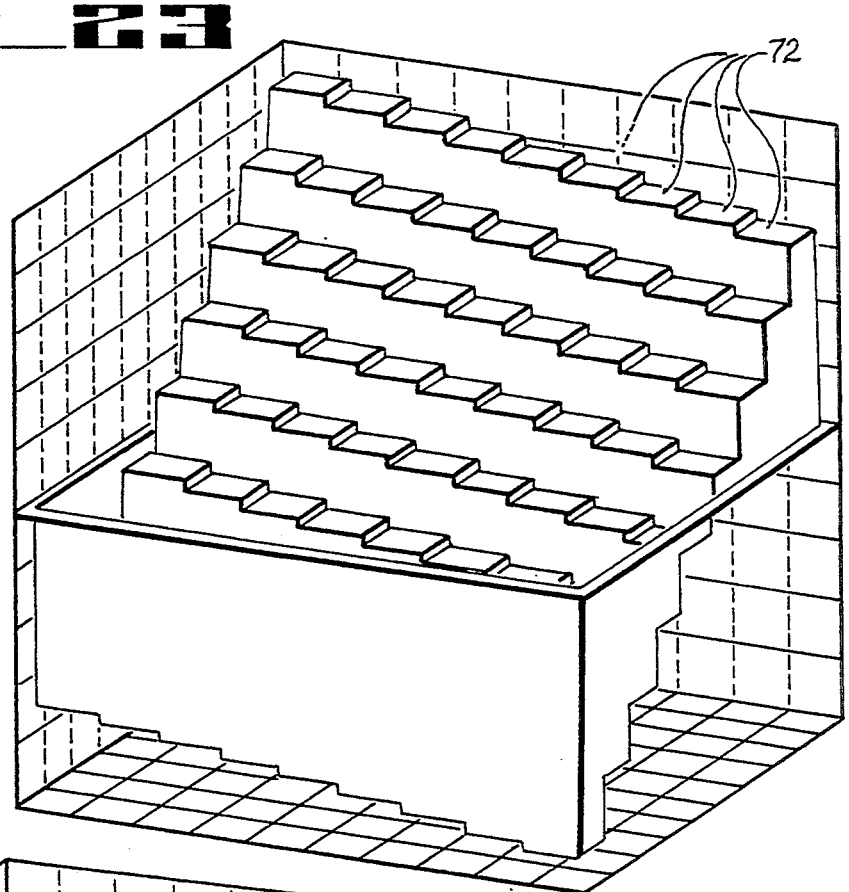
FIG_23
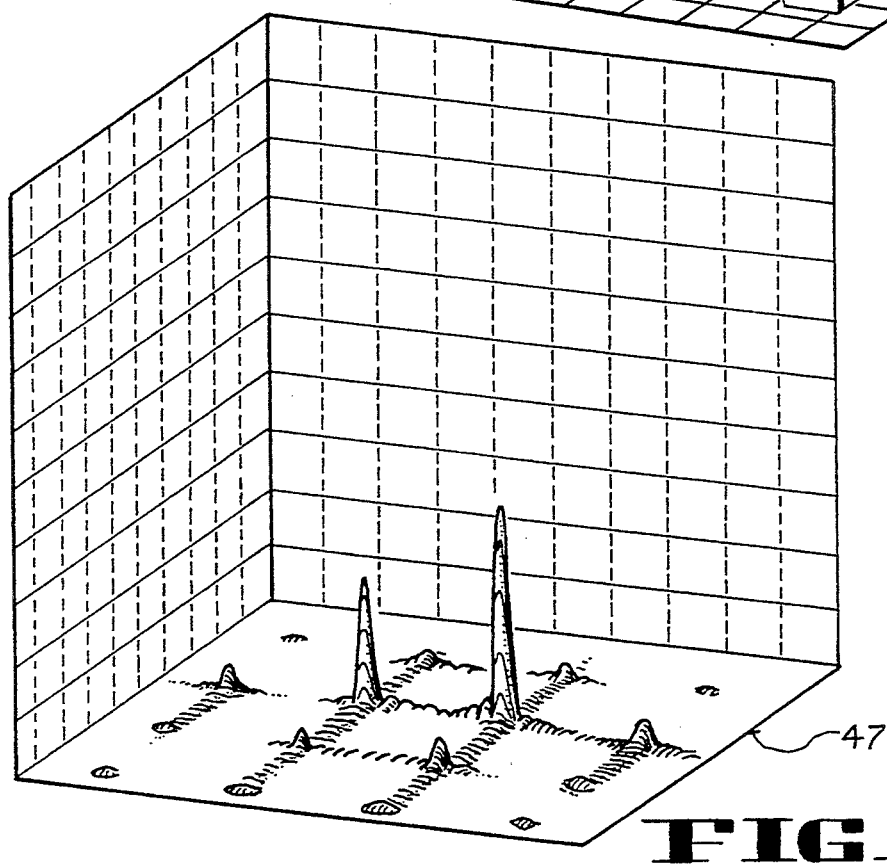
FIG_24

FIG_25
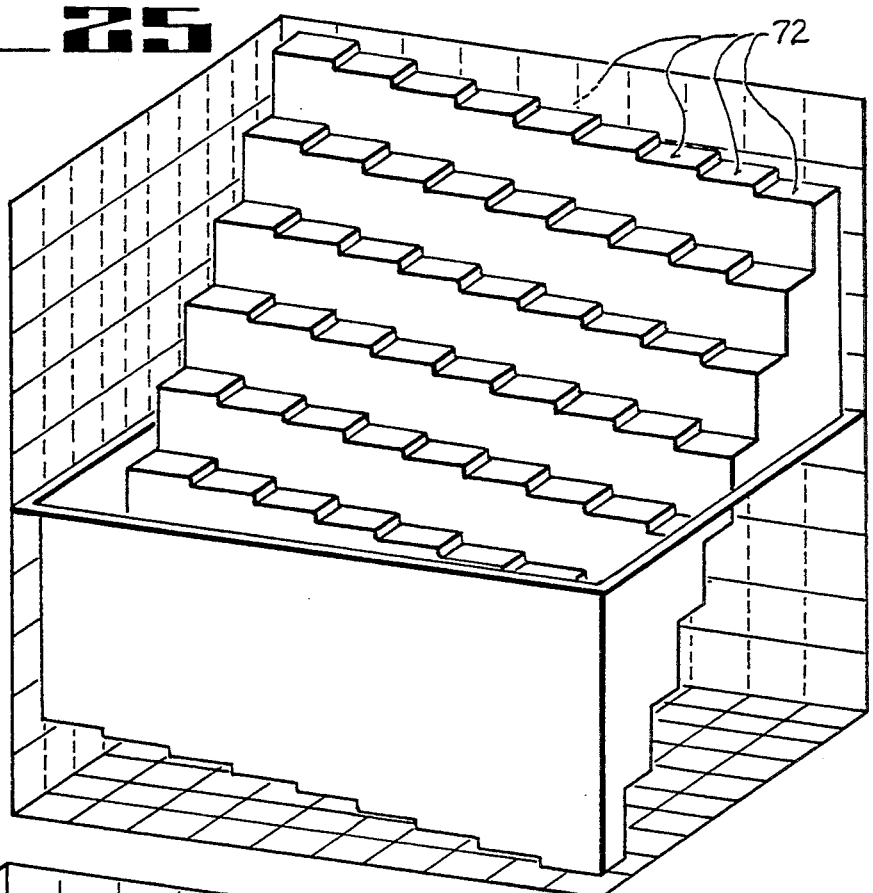
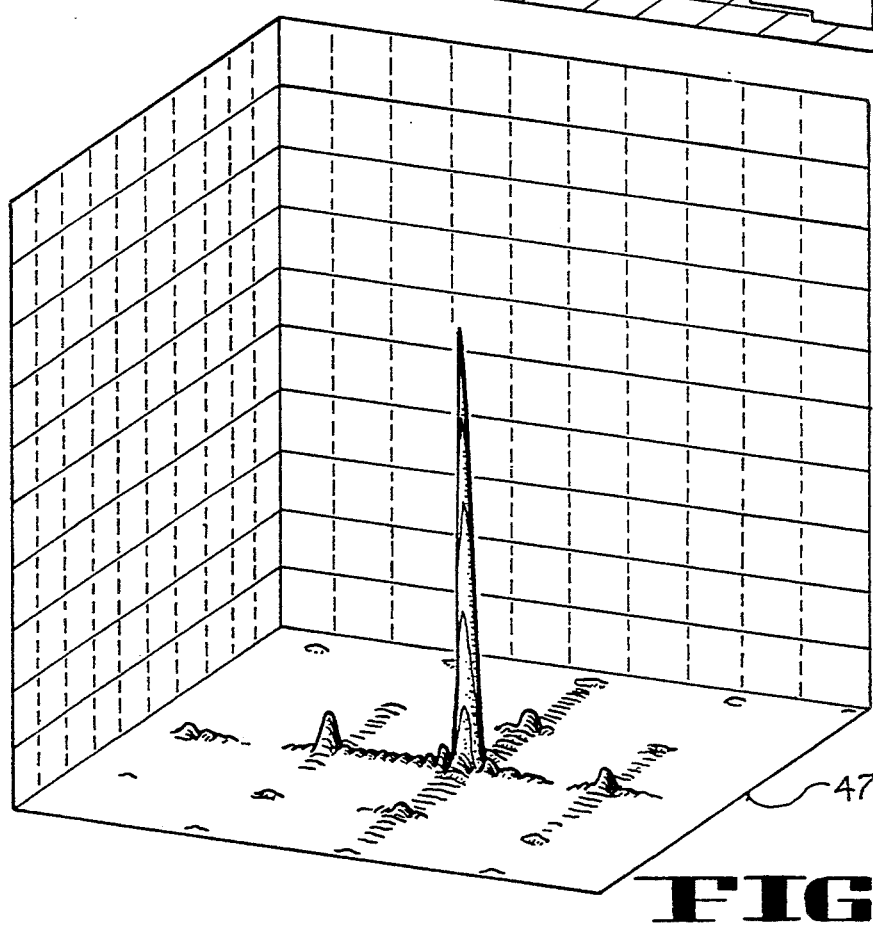
FIG_26

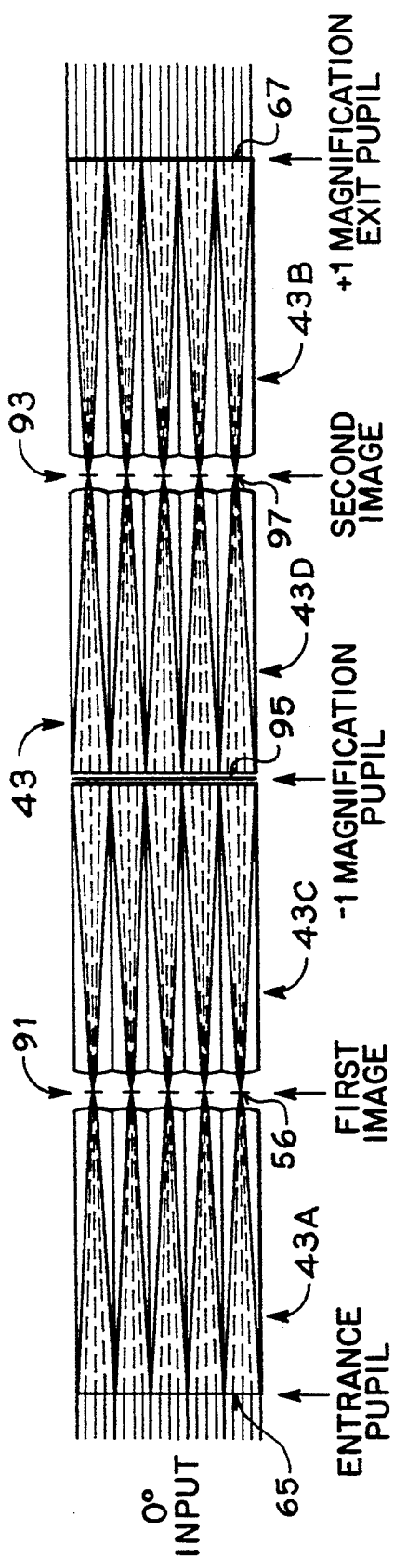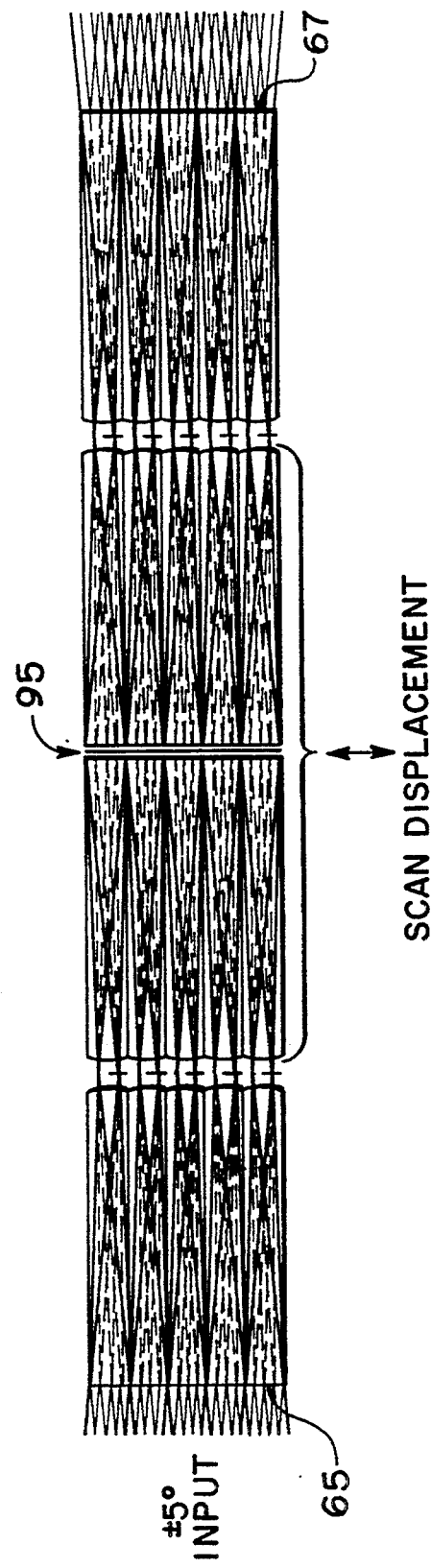

FIG_29
YD = 3.0 μm
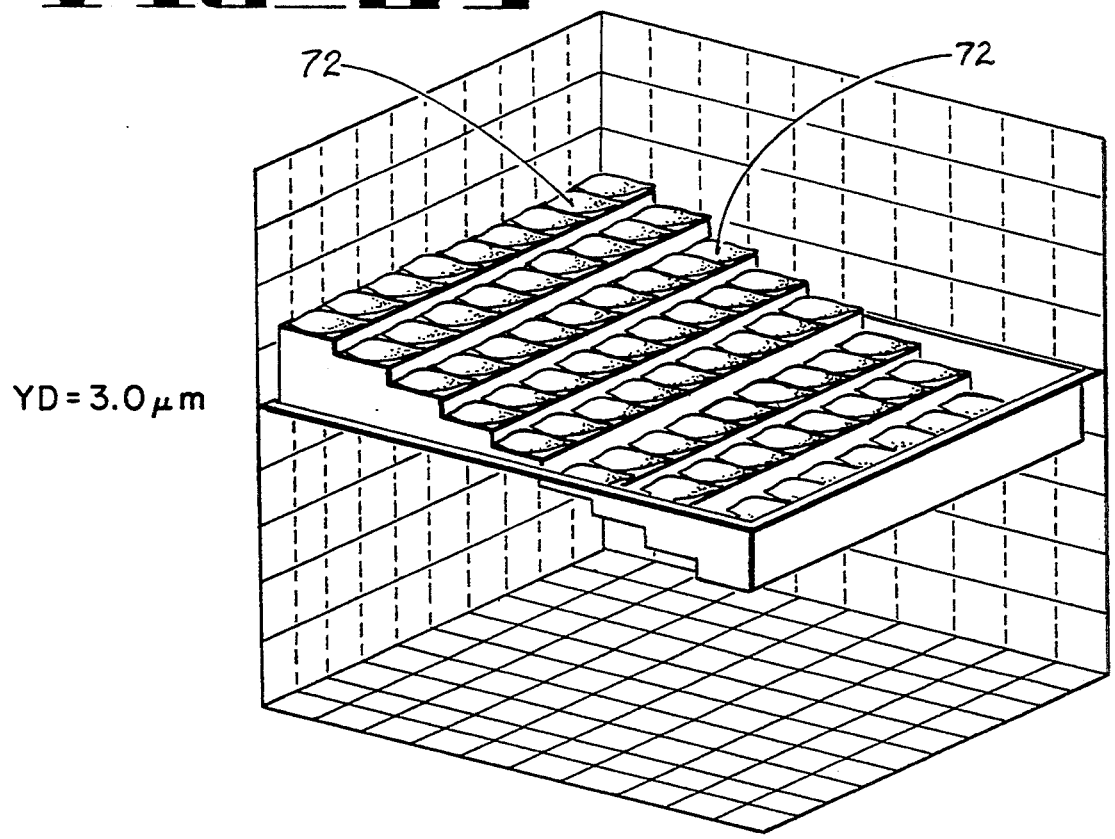
FIG_30
YD = 3.0 μm
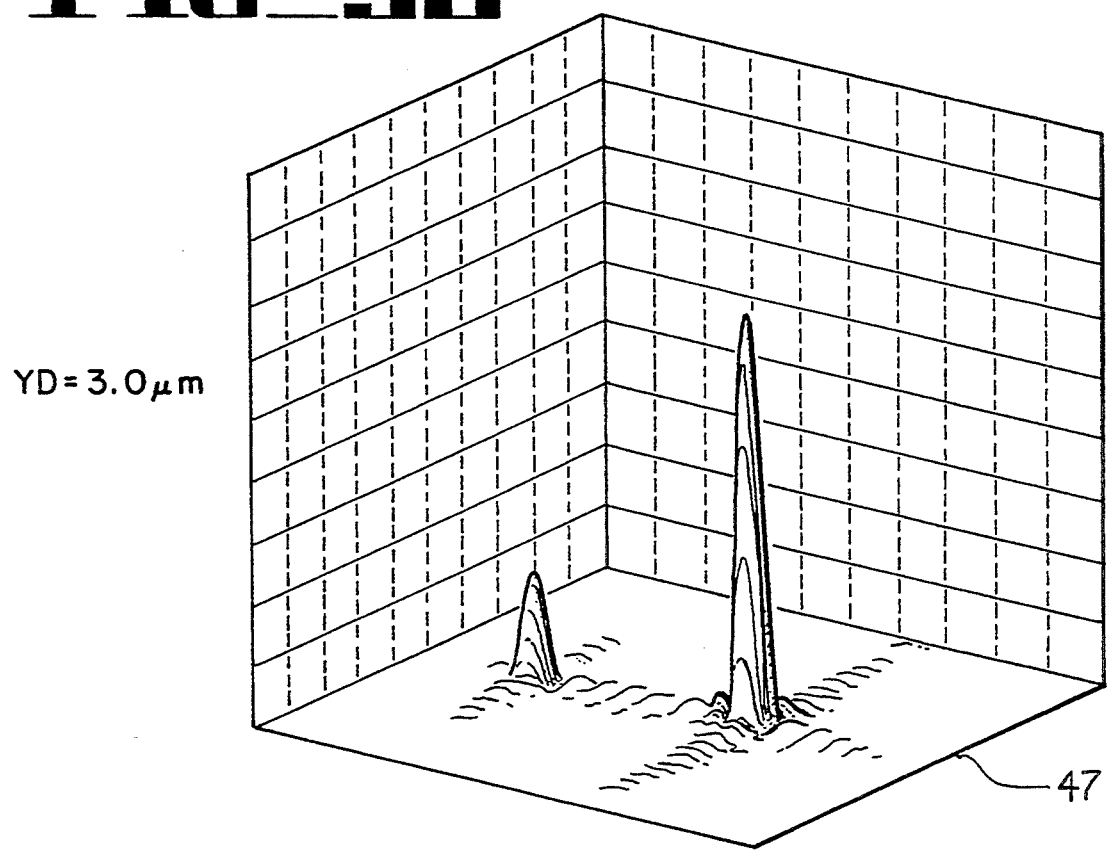

FIG_31
MOSAIC WAVEFRONT ARRAY OPTICAL PATH DIFFERENCE
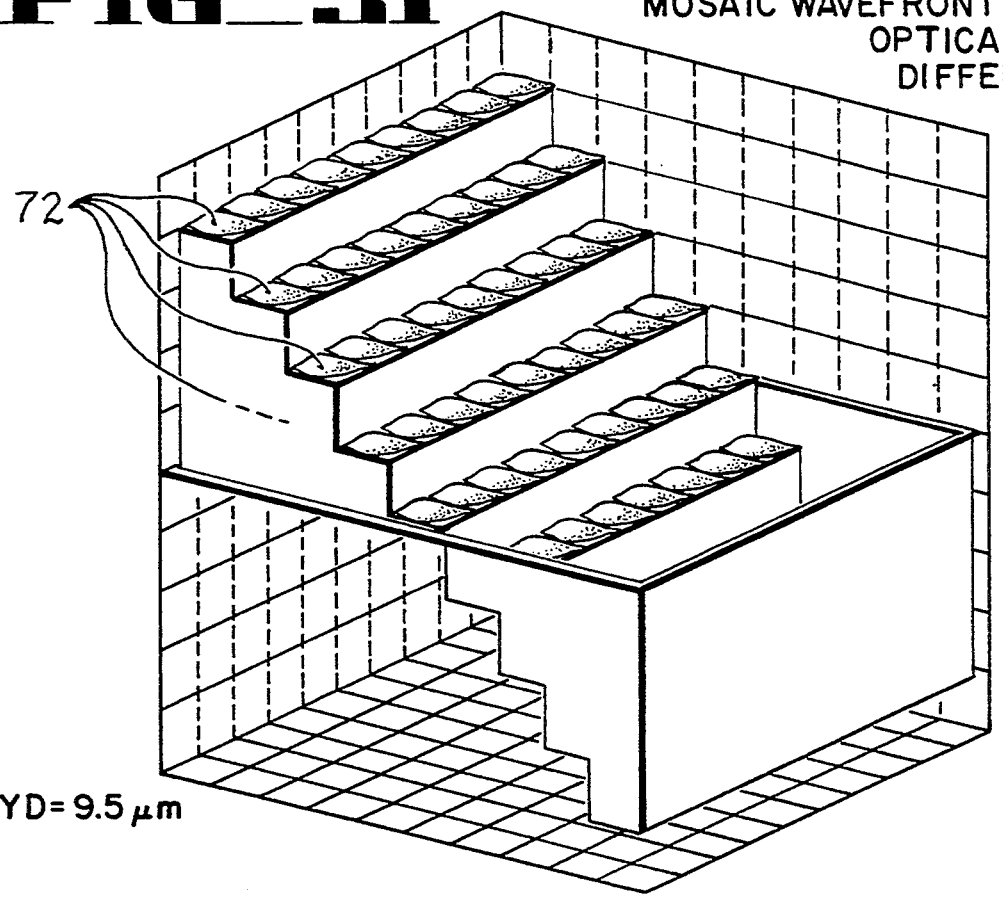
72
YD = 9.5 μm
FIG_32
MONOCHROMATIC DIFFRACTION POINT SPREAD FUNCTION POINT SPREAD RESPONSE
I WAVE STEPS EQUIVALENT EIGEN ANGLE
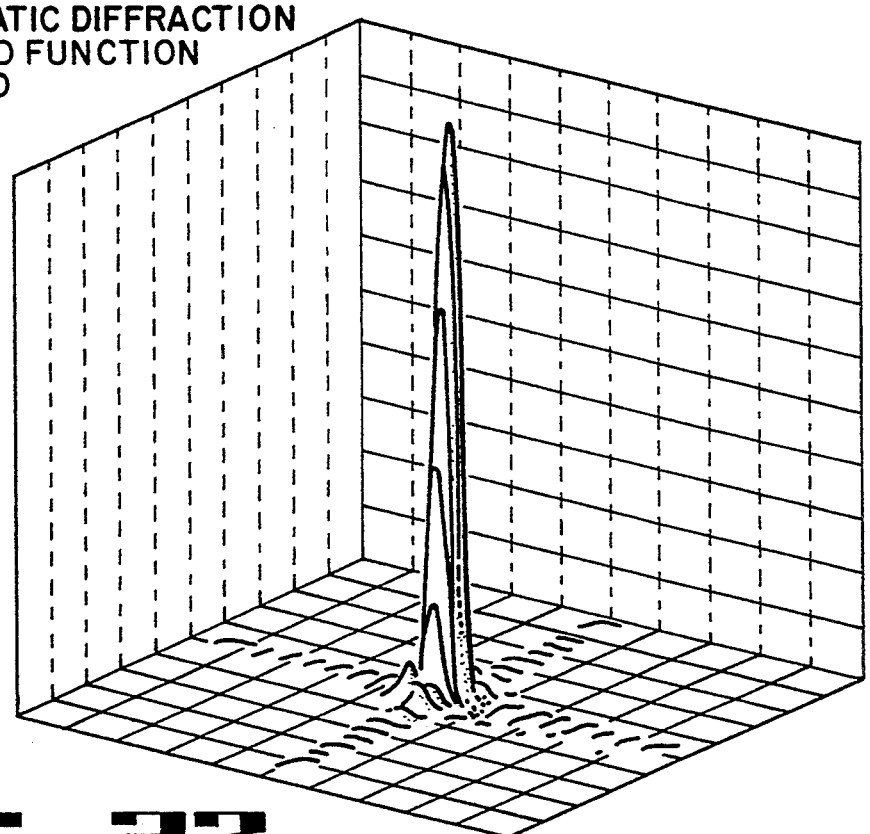

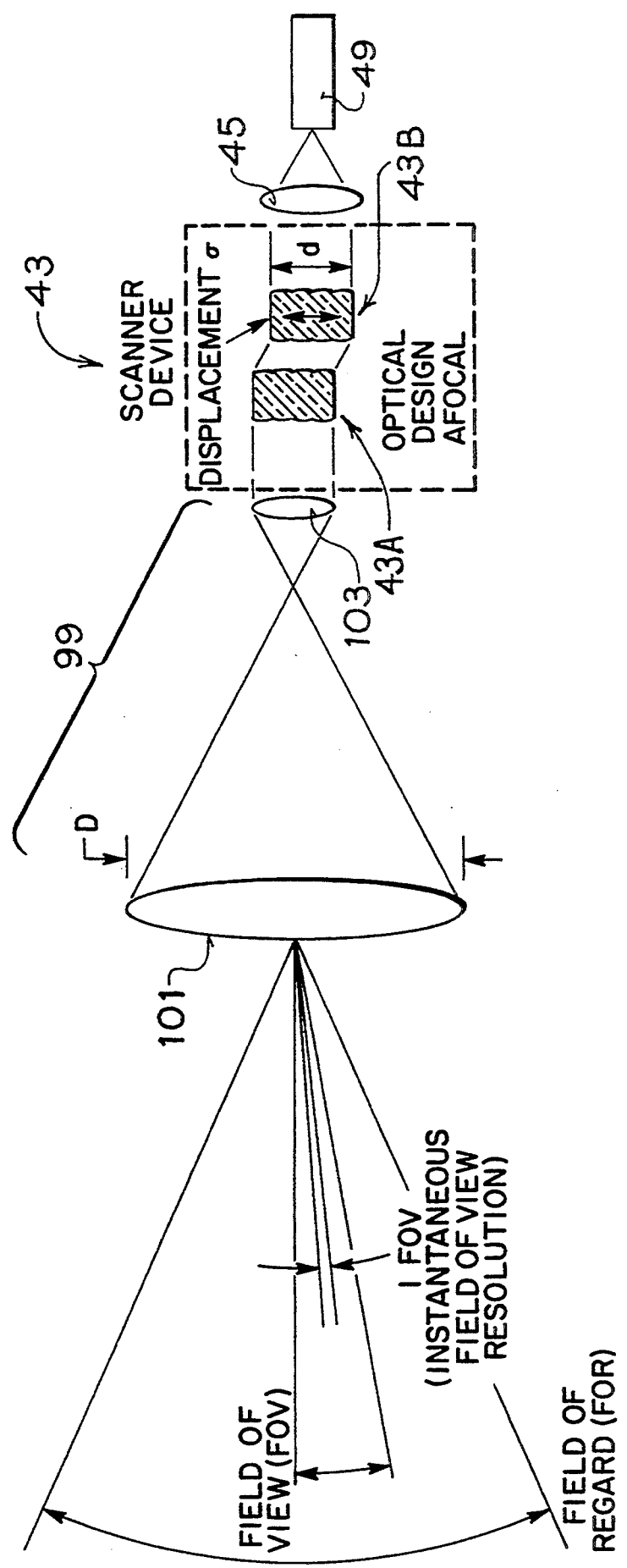
FIG_33

INTERNALLY COOLED LARGE APERTURE MICROLENS ARRAY WITH MONOLITHICALLY INTEGRATED MICROSCANNER

The Government has rights in this invention pursuant to Contract DASG60-90-0012 awarded by the Department of the Army.

CROSS REFERENCES TO RELATED U.S. APPLICATIONS

This application is a continuation-in-part of U.S. patent application Ser. No. 07/904,316 filed Jun. 25, 1992 and entitled "DISPERSIVE MICROLENS", Attorney Docket No. P-03-813 (F-1033-P), George Gal (inventor), and assigned to the same assignee as the assignee of this application. This application claims the benefit of the filing date for the subject matter which is common to the parent application Ser. No. 07/904,316 filed Jun. 25, 1992 pending.

This application is also a continuation-in-part of a application Ser. No. 07/982,514 filed Nov. 27, 1992 and entitled "METHOD AND APPARATUS FOR FABRICATING MICROLENSES", now U.S. Pat. No. 5,310,623, issued on May 10, 1994, George Gal (inventor), and assigned to the same assignee as the assignee of this application. This application claims the benefit of the filing date for the subject matter which is common to the parent application Ser. No. 07/982,514 filed Nov. 27, 1992.

BACKGROUND OF THE INVENTION

This invention relates to a large aperture microlens array apparatus.

This invention relates particularly to a large aperture microlens array assembly having at least two arrays of microlenses with individual unit cell trains optically interconnecting individual microlenses in one array with related individual microlenses in another array. In each unit cell train the light entering an entrance pupil of a microlens in one array is transmitted through the exit pupil of a related microlens of the other array to provide a collimated output through the exit pupil.

SUMMARY OF THE INVENTION

A large aperture microlens array apparatus constructed in accordance with the present invention includes a first array of microlenses, having a plurality of microlenses disposed across the array, and a second array of microlenses, having a plurality of microlenses disposed across the array. Unit cell train means optically interconnect individual microlenses in the first array with related individual microlenses in the second array so that light entering an entrance pupil of a microlens in one array is transmitted through the exit pupil of a related microlens in the other array.

The microlenses and unit cell train means are constructed so that a microlens in one of the arrays images the light entering the entrance pupil and transmits, through a related individual unit cell train, the imaged light to a related microlens in the other array. The related microlens in the other array receives the imaged light, through the related individual unit cell train, and provides a collimated output through the exit pupil.

The individual unit cell trains coact to provide a large aperture for transmitting a beam of light or a multiplicity of beams of light as a composite or composites of the light beam segments transmitted through the individual unit cell trains over a field of view of the aperture.

The arrays of microlenses are constructed to form an afocal large aperture in which light can be transmitted in either direction through the arrays of microlenses.

In certain embodiments of the invention, beam-shaping means are disposed adjacent the exit pupil side of the aperture for shaping the beam of light transmitted through the large aperture.

In one embodiment of the invention a telescope is positioned adjacent the entrance pupil side of the aperture. The telescope reduces the diameter of the beam of light, as transmitted through the telescope to the aperture, so that a smaller size (diameter) of the arrays of microlenses can be used to scan a particular aperture field of regard than the aperture field of regard possible without the telescope.

The construction of the microlenses in the arrays provides optically inactive volumes with respect to the individual microlenses in each array. The optically inactive volumes can be used for functions other than transmitting a beam of light through a large aperture.

In a certain embodiment of the invention cooling channels, for the circulation of cooling fluid, are fabricated in the optically inactive volumes, within at least one of the microlens arrays, for removing heat transmitted into or generated within that microlens array. The cooling channels can be fabricated within all of the arrays.

In one embodiment of the invention the first and second arrays of microlenses are mounted in a static, fixed relationship to one another.

In another embodiment of the invention one of the arrays is mounted for dynamic movement with respect to the other array. The movement of one array with respect to the other array permits scanning and viewing of a larger aperture field of regard than the aperture field of view possible with a static, fixed mounting of the two arrays.

Array positioning and control apparatus change the position of one array with respect to the other and control the exact position of one array with respect to the other array.

In certain embodiments of the invention the light transmitted through the large aperture is monochromatic light of a certain frequency, and the movable array is positionable at a plurality of Eigen positions with respect to the frequency of the monochromatic beam of light to provide improved diffraction point spread function response and, in some cases, to obtain satisfactory image quality.

In certain embodiments of the invention each individual unit cell train provides a minus one ($-1$) magnification of the exit pupil as an image of the entrance pupil. The minus one ($-1$) magnification can be achieved with just two arrays of microlenses. The minus one ($-1$) magnification referred is a minus one ($-1$) magnification as can be achieved within design and engineering tolerances and might in fact vary by some percentage.

In several embodiments of the invention the first array comprises individual microlenses which function as wide field static imagers in each related unit cell train, and the second array comprises individual microlenses which function as collimating scanners in each related individual unit cell train.

In certain embodiments of the present invention the movable array is movable over an arc to provide the collimating scanner function.

In certain embodiments of the invention each unit cell train has a related microlens in the first array which is constructed to form the light entering the entrance pupil of that microlens into an internal image within that microlens, and the entrance pupil serves as the aperture stop for the unit cell train.

In one embodiment of the invention in which the unit cell trains produce a minus one (−1) magnification and in which only two arrays of microlenses are used, the second array is movable with respect to the first array to provide scanning.

In this embodiment each microlens in each array has two surfaces.

In this embodiment the front surface of each microlens in the first array (which forms the entrance pupil) is constructed as a general aspheric surface. This first, general aspheric surface may be a rotationally symmetric surface. This surface may be a non-rotationally symmetric surface for operation at a look angle which is biased with respect to a normal of the surface of the large aperture.

The second surface of each microlens in the first array is a general aspheric surface.

Each unit cell train includes an air space within the related microlenses in the first and second arrays; and the second, general aspheric surface of a microlens in the first array renders the air space telecentric and corrects coma in the unit cell train.

The third surface of a unit cell train is the inlet surface on a microlens of the second array and is a conic aspheric surface to form the outlet pupil on the fourth, exit pupil surface of the microlens in the second array.

The fourth, exit pupil outlet surface on a microlens in the second array is a general aspheric surface which collimates the output, corrects aspherical aberration and functions as an exit pupil at minus one (−1) magnification.

In one embodiment of the invention all the surfaces on the microlenses in a unit cell train are refractive surfaces.

In another embodiment of the invention at least some of the surfaces in a unit cell train are diffractive surfaces or a combination of diffractive and refractive surfaces.

In another embodiment of the invention the microlens array assembly comprises more than two arrays of microlenses and provides a plus one (+1) magnification at the outlet of the aperture. Each individual unit cell train in this embodiment has three pupils comprising the entrance pupil, the exit pupil, and an internal pupil; and each unit cell train forms two internal images.

Another embodiment of the invention provides a fabrication process for forming cooling channels in silicon used for the microlens array assembly. This process includes a fusion bonding between two blocks of silicon, after the cooling channels have been etched into one of the blocks, and includes a subsequent fabrication of microlenses on the outer surfaces of the two fused blocks of silicon. The fabrication of the microlenses may be produced by binary etching or preferably by gray scale fabrication as disclosed in pending U.S. application Ser. No. 07/982,514 filed Nov. 27, 1992 and entitled "METHOD AND APPARATUS FOR FABRICATING MICROLENSES", George Gal (inventor) and assigned to the same assignee as the assignee of this application. As noted above, this co-pending application Ser. No. 07/982,514 is a parent application of this application; and the application Ser. No. 07/982,514 is incorporated by reference in this application.

The co-pending application Ser. No. 07/904,316 filed Jun. 25, 1992, entitled "DISPERSIVE MICROLENSES", George Gal (inventor), and which is also noted above as a parent application of this application, discloses binary techniques for fabricating arrays of microlenses having refractive surfaces and having diffractive surfaces. The application Ser. No. 07/904,316 filed Jun. 25, 1992 is incorporated by reference in this application.

Methods and apparatus which incorporate the features described above and which are effective to function as described above constitute further, specific objects of the invention.

Other and further objects of the present invention will be apparent from the following description and claims and are illustrated in the accompanying drawings, which by way of illustration, show preferred embodiments of the present invention and the principles thereof and what are now considered to be the best modes contemplated for applying these principles. Other embodiments of the invention embodying the same or equivalent principles may be used and structural changes may be made as desired by those skilled in the art without departing from the present invention and the purview of the appended claims.

BRIEF DESCRIPTION OF THE DRAWING VIEWS

FIG. 1 is an isometric view of a large aperture microlens array apparatus constructed in accordance with one embodiment of the present invention. FIG. 1 is partly broken away and shown in cross section through the arrays of microlenses. The cross section shows how the arrays are constructed to create optically inactive volumes in the arrays.

FIG. 2 is an enlarged, fragmentary view in cross section showing details of the structure encircled by the arrows 2—2 in FIG. 1. FIG. 2 shows optical unit cell trains between related microlenses in the two arrays and shows how micro cooling channels are positioned within the optically inactive volumes in the arrays of the microlenses.

FIGS. 3–6 are isometric views showing how a sequence of fabrication steps are used for forming the cooling channels in the array material and then forming the microlenses on the surfaces of the array material of the microlens arrays shown in FIGS. 1 and 2.

FIG. 3 shows how cooling channel grooves are etched into the array material.

FIG. 4 shows how a plate of array material is fusion bonded to the block of array material in which the grooves have been etched.

FIG. 5 shows how the fusion bonded assembly is trimmed and polished on both outer surfaces.

FIG. 6 shows how the microlenses are formed on the outer surfaces which had been trimmed and polished. The surfaces of the microlenses shown in FIG. 6 can be formed by binary etching or by gray scale etching.

FIG. 7 is a fragmentary, enlarged, isometric view, partly broken away and in cross section, showing the construction and the dynamics of operation of a single, unit cell train and the two related microlenses in the microlens array assembly shown in FIGS. 1 and 2. FIG. 7 shows how the light entering an entrance pupil in the upper (as viewed in FIG. 7) microlens in one of the arrays is formed into an internal image within the unit cell train and is transmitted out of an exit surface in the lower (as viewed in FIG. 7) microlens. FIG. 7 illustrates how the forming of the entering light to an internal image provides optically inactive volumes within the arrays of microlenses and shows how the optically inactive volumes are, in this case, utilized for cooling channels.

FIG. 8 is a fragmentary, enlarged view in cross section taken along the line and in the direction indicated by the arrows 8—8 in FIG. 9.

FIG. 9 is a fragmentary, enlarged view in cross section taken along the line and in the direction indicated by the arrows 9—9 in FIG. 1 and FIG. 2.

FIGS. 8 and 9 show details of both the micro cooling channels and the macro cooling channels for circulating cooling fluid in the microlens arrays shown in FIGS. 1 and 2.

FIG. 10 is a isometric view of a large aperture microlens array apparatus, like FIG. 1, but showing another embodiment of the present invention. In the embodiment shown in FIG. 10, one of the arrays of microlenses is mounted for dynamic movement with respect to the other array to permit scanning and viewing of a larger aperture field of regard than the aperture field of view possible with a static, fixed mounting of the two arrays.

FIGS. 11-16 are side elevation views of a unit cell train used in the FIG. 10 embodiment and comprising one microlens in one array and a related microlens in the other array.

FIG. 11 shows how the second, collimating scanner microlens in the unit cell train (the microlens on the right hand side of FIGS. 11-16) scans upwardly and downwardly over an arc with respect to the first, wide field static imager microlens (the microlens on the left hand side of FIGS. 11-16) in the cell train. The extent of the upward and downward scanning movement is indicated in FIG. 11 by the solid line and dashed line positions of the collimating scanner microlens. It should be noted that the scan is achieved in a single direction (as drawn in FIG. 11) or in a direction normal to that illustrated, or in both directions simultaneously.

Each of FIGS. 11-16 trace representative rays of the light transmitted through the unit cell train.

FIGS. 12-16 show the collimating scanner microlens positioned at respective 0°, 5°, 10°, 15° and 20° angles with respect to the wide field static imager microlens.

FIG. 17 is a series of views showing the blur spots produced when the light transmitted out of the unit cell train shown in FIG. 12 is brought to a focus by a beam-shaping lens assembly. The blur spots shown in FIG. 17 are the blur spots which are produced by one individual unit cell train looking at the different instantaneous fields of view (IFOV) indicated by the respective cross scan and along scan coordinate locations shown in FIG. 17 with the collimating scanner element of the unit cell train in the 0° scan position shown in FIG. 12. The blur spots shown in FIG. 17 are blur spots produced by monochromatic light. This FIG. 17 shows the quality of the image over a 4° field of view as viewed by one cell train at a fixed position (not scanned) of 0°.

FIG. 18 is a view like FIG. 17 but showing the blur spots produced by an individual unit cell train positioned at the 20° angle of scan of the collimating scanner element as shown in FIG. 16. FIGS. 17 and 18 demonstrate the high degree of optical correction and image quality over a substantial (4° by 4°) FOV at every FOR to plus or minus 20°.

FIG. 19 is a cross section view through the two microlens arrays of the embodiment shown in FIG. 10 with the collimating scanner elements at a 0° scan angle. FIG. 19 traces representative rays through the individual unit cell trains for a 0° angle of scan and illustrates how the forming of the internal image provides optically inactive volumes in the arrays. The two microlens arrays shown in FIGS. 10-19 provide a minus 1 (−1) magnification at the exit pupil. FIG. 19 also shows how cooling channels are incorporated within the optically inactive volumes in one of the arrays (the array on the left hand side as viewed in FIG. 19).

FIG. 20 is a computer generated, isometric view showing the mosaic of wavefronts just after the exit pupil surface of a 9×9 array of unit cells at the 0° angle of scan shown in FIG. 19. At a 0° scan angle and with monochromatic light the minus one (−1) magnification unit cell trains shown in the FIG. 19 arrays produce a composite wavefront at the outlet of the large aperture in which there is no offset between the adjacent wavefronts at the exit pupils of the individual unit cell trains.

FIG. 21 is a computer-generated, isometric view correlated to FIG. 20 and showing the monochromatic diffraction point spread function at the focal plane of an imaging telescope for the arrays of microlenses shown in the FIG. 10 embodiment at a 0° scan as shown in FIG. 19 and for monochromatic light.

FIG. 22 is a view like FIG. 19 but shows the collimating scanner microlenses in the scanning array positioned at a 20° angle of scan. FIG. 22 illustrates how, at this large angle of scan, the light transmitted through the individual unit cell trains is imaged to provide optically inactive volumes which are sufficiently large enough for the inclusion of the cooling channels without any interference with the optical performance of the individual unit cell trains.

FIG. 22 also illustrates how, with the minus 1 (−1) magnification construction, an incoming wavefront (illustrated by the line normal to the ray traces in front of the entrance pupils) becomes offset in the segments of the composite light beam transmitted through the exit pupils of the individual unit cell trains. The amount of the offset (an offset in phase from one segment to another segment) depends upon the wavelength of the monochromatic light being transmitted through the microlens arrays and the physical spacing between the unit cell centers and the angle of incidence of the incoming wavefront to the array. The offsets occur because of the differences in the lengths of the optical paths from an incoming wavefront through adjacent cell trains. In this case, diffraction point spread function formation occurs ideally when there is an integer number of wavelengths from step to step in the offsets. This condition occurs at a two dimensional (x,y) sequence of discrete angles which will be referred to as Eigen angles.

FIG. 23 is a view like FIG. 20 but showing the offset of the individual wavefronts transmitted through the individual exit pupils at the 5° angle of scan shown in FIG. 13.

FIG. 24 is a view like FIG. 21 but showing how the point spread response is distributed into a series of spaced apart peaks of varying magnitude at the focal plane for the 5° angle of scan shown in FIG. 13 and for monochromatic light of a 4.0 micrometer wavelength. This 5° angle of scan was not substantially an Eigen angle (or in close proximity to an Eigen angle) for the particular wavelength of the monochromatic light transmitted through the arrays.

FIG. 25 is a view like FIG. 20 but showing the offsets for images transmitted through the individual unit cell trains in two 9×9 microlens arrays having the minus 1 (−1) magnification construction shown in FIG. 10 with a 5° angle of scan as shown in FIG. 13 and operating with monochromatic light at a wavelength of 3.775 micro meters.

FIG. 26 is a view like FIG. 21 but showing the monochromatic diffraction point spread function for the 5° angle of scan shown in FIG. 13. This 5° angle of scan was substantially an Eigen angle for the particular 3.775 micrometer wavelength of monochromatic light transmitted through the arrays.

FIG. 26 illustrates how a point source can be resolved, but an extended image (over a substantial field of view) is not satisfactorily resolved with minus one (−1) magnification under these circumstances.

FIG. 27 is a side elevation view showing unit cell trains in a microlens array assembly constructed in accordance with another embodiment of the present invention. The unit cell trains in this embodiment provide plus one (+1) magnification. The embodiment shown in FIG. 27 comprises four arrays of microlenses (rather than just the two arrays of microlenses shown in the minus one (−1) magnification cell train embodiments shown in FIGS. 1 and 10). In FIG. 27 the back to back arrays in the center of the unit cell trains are movable with respect to the outer arrays to provide scanning. FIG. 27 shows all of the elements of a unit cell train aligned for a 0° angle of scan, and FIG. 27 traces representative rays through the unit cell train for this 0° angle of scan.

FIG. 28 is a view like FIG. 27 but traces representative light rays through the unit cell train for a plus 5° angle of scan and for a minus 5° angle of scan.

FIG. 29 is a view like FIG. 20 but shows the offset of the wavefronts from the respective individual unit cell trains in a 9×9 array of microlenses for an offset of the scanning arrays of 3.0 micro meters for the plus one (+1) unit cell train embodiment shown in FIGS. 27 and 28. This particular scanning offset position was not an Eigen position for the particular wavelength of the monochromatic light transmitted through the individual unit cell trains.

FIG. 30 is a view like FIG. 21 showing the monochromatic diffraction point spread function corresponding to the offsets in the wavefronts as illustrated in FIG. 29.

FIG. 31 is a view like FIG. 20 showing offsets of the images transmitted through the individual cell trains of a 9×9 microlens array having the plus one (+1) magnification unit cell train construction illustrated in FIGS. 27 and 28, but for an offset equal to 9.5 micro meters.

FIG. 32 is a view like FIG. 21 but showing the monochromatic diffraction point spread function for the 9.5 micro meter offset illustrated in FIG. 31. In this case the 9.5 micrometer offset position of the scanner element was an Eigen position with respect to the wavelength of the monochromatic light transmitted through the four arrays of microlenses.

FIG. 32 illustrates how a point source can be resolved, but a substantially extended FOV image is also satisfactorily resolved with a plus one (+1) magnification under monochromatic circumstances.

FIG. 33 is a side elevation view showing how, in accordance with another embodiment of the invention, a telescope can be positioned adjacent the entrance side of the large aperture. The telescope reduces the diameter of the light beam transmitted through the telescope. This enables a smaller size (diameter) of the arrays of microlenses to be used for viewing a particular field of regard, using the scanning movement of the movable array of the microlenses, than would be possible without the telescope.

FIG. 34 is a view listing the optical design parameters (prescription) for the unit cell train shown in FIG. 11 with one millimeter square microlenses constructed of silicon having an index of refraction of 3.426963.

DETAILED DESCRIPTION OF THE PREFERRED EMBODIMENTS

One embodiment of a large aperture microlens array apparatus constructed in accordance with the present invention is indicated generally by the reference numeral 41 in FIG. 1.

In this embodiment the apparatus 41 includes a microlens array assembly 43, a beam shaping lens assembly 45, and a focal plane 47.

A detector 49 (which may be a monochromatic or a polychromatic detector) is located at the focal plane for detecting light transmitted through the apparatus 41 from the top to the bottom as viewed in FIG. 1 and in FIG. 10. The detector 49 in both FIG. 1 and FIG. 10 has individual pixels 50. The individual pixels are shown in FIG. 10 but are not shown in FIG. 1.

The large aperture provided by the microlens array assembly 43 is afocal and light can also be transmitted through the apparatus 41 from the right to the left as viewed in FIG. 1.

A light source, such as, for example, a monochromatic laser 51, can be mounted at the focal plane in place of or in addition to the detector 49; and the laser acts as a light source for projecting light through the apparatus 41.

The reference numerals 53, 54, 55 and 57 trace representative light rays as transmitted through the apparatus 41. This will be described in more detail below with particular reference to FIG. 7.

As shown in FIG. 1 and FIG. 2, the microlens array assembly 43 comprises two arrays 43A and 43B of microlenses mounted in fixed, static relationship to one another.

The first array 43A of microlenses comprises individual microlenses 61, each having an entrance pupil 65 (when light is transmitted through the apparatus 41 from left to right as viewed in FIG. 1). The second array of microlenses comprises individual microlenses 63, each of which has an exit surface 67 (when light is transmitted through the apparatus 41 from left to right as viewed in FIG. 1).

A unit cell train comprising an individual microlens 61 in one array and a related individual microlens 63 in the other array is indicated by the reference numeral 68 in FIG. 7.

As light is transmitted through the apparatus 41 (from left to right as viewed in FIG. 1 and from top to bottom as viewed in FIG. 7) an incoming ray 53 is refracted as it passes through the refractive surface on the pupil 61 and travels through the first microlens at a particular angle, as indicated by the reference numeral 54. All of the light incoming to an individual microlens is therefore imaged at 56, and the image is then transmitted to the exit pupil 67 of a related microlens 63. The light ray exits as 55 at the same angle (with respect to the other light rays in the bundle, or segment, of light rays transmitted through the individual unit cell train provided by the related microlenses 61 and 63) as the angle at which that light ray entered the microlens array assembly 43. All of the light entering an entrance pupil 65 is transmitted out of the exit surface 67 when the assembly 43 is perpendicular to the incoming light as illustrated in FIG. 1 without vignetting for a substantially narrow field of view.

FIG. 7 shows how an incoming ray 53 is refracted and follows a path 54 traveling through the microlenses of the unit cell train 68 and then exits as the ray 55.

The individual unit cell trains 68 in the microlens array assembly 43 coact to provide a large aperture for transmitting a beam of light as a composite of the individual light beam segments transmitted through the individual unit cell trains in the microlens array assembly 43.

The light beam segments transmitted through the individual unit cell trains are combined at the outlet of the large aperture provided by the microlens array assembly 43, and the combining of these light beam segments produces a composite beam of light at the outlet of the array substantially corresponding to the incoming beam of light entering the microlens array assembly 43.

In the static, fixed mounting of the two arrays of microlenses in the assembly 43 as illustrated in FIGS. 1 and 2, the individual unit cell trains each provide a minus one (−1) magnification.

The mechanism of operation of a unit cell train and the way in which a unit cell train collimates the light at an exit pupil with respect to the light at the entrance pupil will be described in more detail below with particular reference to FIGS. 11–16, 19 and 22.

Because the light at an exit pupil of a cell train is collimated, as is the light at the entrance pupil, the microlens assembly 43 provides an afocal optical design. Light is permitted to be transmitted in either direction through the apparatus 41.

When a light source, such as, for example, a laser 51, is used to project light in a direction from right to left (as viewed in FIG. 1), the light incoming to the microlens array assembly 43 is represented by the reference numeral 55 and the outgoing light is represented by the reference numeral 53.

It is a very important feature of the present invention that the microlens array assembly 43 forms an internal image 56 in each individual unit cell train to provide optically inactive volumes 59 in the microlens array assembly 43.

These optically inactive volumes can be used for non-optical functions.

In the embodiment of the invention illustrated in FIGS. 1 and 2, the optically inactive volumes 59 are used for the construction and operation of micro cooling channels 69.

As best illustrated in FIGS. 8 and 9, each micro cooling channel 69 is connected to macro cooling channels, or manifolds, 71. A pump 73 circulates cooling fluid from a tank or reservoir 75. A heat exchanger or radiator 79 is connected in series with the tank 75 and the pump 73 for radiating or otherwise removing heat from the cooling fluid circulated through the cooling channels 69.

The heat removed from the microlens array assembly 43 can be heat which is transmitted into the array, or it can be heat which is generated within the microlens array assembly.

Thus, for example, if a relatively high powered laser 51 is used as a light projector, the laser light itself, in passing through the microlens array assembly 43, can generate heat within the material of the microlenses making up the arrays.

By way of further example cooling may be required to reduce the self emission of heat for sensor sensitivity requirements.

FIGS. 3–6 are isometric views showing a sequence of fabrication steps used for forming the cooling channels 69 in the silicon material of the assembly 43.

These FIGS. 3–6 also show how the microlenses are then formed on the surfaces of the silicon material, after the fabrication of the cooling channels 69.

As shown in FIG. 3, the grooves for the cooling channels 69 are etched, by photolithography etching, into an upper surface of a first block 75 of silicon.

As shown in FIG. 4, a second block 77 of silicon is then fusion bonded to the block 75 at the surface at which the cooling channels 69 have been etched.

As shown in FIG. 5, the top and bottom surfaces 79 and 81 of the fused together blocks are then trimmed and polished.

Finally, as shown in FIG. 6, the first array 43A and the second array 43B of microlenses 61 and 63 are then formed on the respective top and bottom surfaces which had previously been trimmed and polished.

The arrays 43A and 43B of the microlenses 61 and 63 can be fabricated either by binary techniques or by the gray scale technique described in pending U.S. patent application Ser. No. 07/982,514 filed Nov. 27, 1992 in the U.S. Patent and Trademark Office by George Gal, inventor, and entitled "METHOD AND APPARATUS FOR FABRICATING MICROLENSES" and assigned to the same assignee and the assignee of this application. The application Ser. No. 07/982,514 is incorporated by reference in this application.

In a specific embodiment of the present invention in which the microlenses were 1 millimeter square microlenses, the grooves 69 were etched to a 300 micrometer depth and a 200 micrometer width. The exact cooling channel dimensions are design options.

Another embodiment of the large aperture microlens array apparatus 41 is shown in FIG. 10.

In the FIG. 10 embodiment, parts which correspond to parts shown in the FIG. 1 embodiment have been indicated by the same reference numerals.

In the embodiment shown in FIG. 10, one array (the array 43B) of microlenses is mounted for dynamic movement with respect to the other array (the array 43A) of microlenses. This permits scanning and viewing of a larger aperture field of regard than the aperture field of view possible with the static, fixed mounting of the two arrays 43A and 43B of the FIG. 1 embodiment.

In FIG. 10 the field of view (the field which can be viewed without any scanning) is indicated by the arrow designated "Field of View (FOV)". The FOV would typically be defined by the overall dimensions of an array detector, such as, the detector 49.

The field of regard which can be viewed by scanning of the array 43B is indicated by the legend "Field of Regard (FOR)".

The instantaneous field of view which can be viewed by an individual unit cell train in the array is indicated by the legend "IFOV (Instantaneous Field of View)" in FIG. 10. The IFOV would typically be defined by the dimensions of a single pixel 50 in the array detector 49.

The overall microlens array assembly 43 thus provides an agile beam steering unit, as indicated by the corresponding legend in FIG. 10.

FIGS. 11–16, 19 and 22 show further details of the arrays 43A and 43B in the FIG. 10 embodiment and further details of the microlenses 61 and 63 within those respective arrays 43A and 43B.

FIG. 34 lists the prescription for the cell train 68 shown in FIG. 11 and comprising one millimeter square microlenses constructed of silicon having an index of refraction of 3.426963.

As shown in FIG. 11, each individual unit cell train 68 comprises a microlens 61 which is a wide field static imager and a microlens 63 which is a collimating scanner.

The collimating scanner 63 scans over a suitable arc (not a plane) and is movable between the solid line position and the dashed line position shown in FIG. 11. It should be noted that the scan is achieved in a single direction (as drawn in FIG. 11) or in a direction normal to that illustrated, or in both directions simultaneously.

As best shown in FIGS. 11–16, each individual unit cell train 68 in the FIG. 10 embodiment includes an air space 83 between the facing surfaces of the wide field static imager 61 and the collimating scanner 63.

Each unit cell train 68, as best shown in FIG. 11, has four surfaces.

Surface number 1 is a general aspheric. This surface forms an internal image 56 and serves as the aperture stop for the unit cell train.

It is an important feature of this invention that all of the light transmitted through the first surface (which is the entrance pupil) passes through the cell train and out surface number 4 (which serves as the exit pupil) without vignetting at all angles of scan and for a 4° by 4° FOV.

In the embodiment shown in FIG. 11 the surface number 1 is a rotationally symmetric surface.

This surface number 1 may also be constructed as a non-rotationally symmetric surface, such as, for example, a toroid, for operation of the large aperture at a look angle which is biased with respect to a normal of the surface of the large aperture 43.

The surface number 2 (as indicated in FIG. 11) is a general aspheric surface and renders the air space 83 telecentric and corrects coma.

The surface number 3 (as indicated in FIG. 11) is a conic aspheric and forms the exit pupil on the surface number 4.

The surface number 4 is a general aspheric. This surface collimates the output, corrects spherical aberration and provides the exit pupil (in the minus one ($-1$) magnification unit cell train 68 illustrated in FIG. 11).

As shown by the wavefront (indicated by the reference numeral 72 in FIGS. 12–16), the collimated output of the light transmitted through the individual unit cell train 68 is in the same phase for all angles of scan of the collimating scanner 63.

However, while all of the light transmitted through an individual unit cell train is in phase, the composite or mosaic transmitted wavefront of the composite or mosaic beam provided by an array of unit cell trains and related microlenses can require phase trimming to adjust the steps in the mosaic wavefront to the nearest integer value of waves in order to form a good diffraction point spread function at the image on a focal plane.

FIG. 17 is a series of views showing the blur spots produced when light transmitted out of the unit cell train shown in FIG. 12 is brought to a focus at the focal plane 47 by the beam shaping lens assembly 45. The blur spots shown in FIG. 17 are blur spots which are produced by one individual unit cell train 68 looking at the different instantaneous fields of view (IFOV) indicated by the respective cross scan and along scan coordinate locations shown in FIG. 17 with the collimating scanner element 63 of the unit cell train 68 in the 0° scan position as shown in FIG. 12. The blur spots in FIG. 17 are blur spots produced by monochromatic light. This FIG. 17 shows the quality of the image over a 4° field of view as produced by one cell train at a fixed position (not scanned) of 0°. As can be seen by viewing FIG. 17, all of the blur spots are produced within the diffraction dark ring 76 as shown in the various views. The diffraction dark rings 76 correspond to the first Airy dark ring at four micrometers wavelength.

FIG. 18 is a view like FIG. 17 but showing the blur spots produced by an individual unit cell train 68 positioned at the 20° angle of scan of the collimating scanner element 63 as shown in FIG. 16.

As can be seen by viewing FIG. 18, the image formation at a full 20° of inclination is good. Across the center of the field, the image is fully diffraction limited and would likely remain tight for another degree or so.

FIGS. 17 and 18 demonstrate the high degree of optical correction and image quality over a substantial (4° by 4°) field of view at every field of regard to plus or minus 20°.

FIG. 19 is a cross section view through the two microlens arrays 43A and 43B of the embodiment shown in FIG. 10 with the collimating scanner elements 63 at a 0° scan angle. FIG. 19 traces representative rays through the individual unit cell trains 68 for a 0° angle of scan and illustrates how the forming of the internal image 56 provides optically inactive volumes 59 in the arrays 43A and 43B.

The two microlens arrays 43A and 43B shown in FIGS. 10–19 provide minus one ($-1$) magnification exit pupils at the exit pupil 67 of each unit cell train.

FIG. 19 also shows how cooling channels 69 are incorporated within the optically inactive volumes 59 in the array 43A of this particular embodiment of the invention.

FIG. 20 is a computer-generated, isometric view showing the mosaic 85 of wavefronts 72 just after the exit pupil surfaces 67 of a 9×9 array of unit cells 68 at the 0° angle of scan shown in FIG. 19. At a 0° scan angle and with monochromatic light the minus one ($-1$) magnification unit cell trains shown in the FIG. 19 arrays produce a composite wavefront (at the outlet of the large aperture microlens array assembly 43) in which there is no offset between the adjacent wavefronts 72 at the exit pupils 67 of the individual unit cell trains.

FIG. 21 is a computer generated, isometric view showing the monochromatic diffraction point spread function at the focal plane 47 of an imaging telescope in the FIG. 10 embodiment with the array 43B at a 0° scan angle as shown in FIG. 19 and for monochromatic light. FIG. 21 is the diffraction point spread function corresponding to the image view shown in FIG. 20.

The view shown in FIG. 20 is the actual wavefront tangent to the exit pupil but just outside the surface number 4 (see FIG. 11) of the individual unit cell trains. These individual wavefronts 72 are slightly cupped, as illustrated, rather than being completely flat due to a small residual spherical aberration in the unit cell train.

FIG. 22 is a view like FIG. 19 but shows the collimating scanner microlenses 63 in the scanning array 43B positioned at a 20° angle of scan.

FIG. 22 illustrates how, at this large angle of scan, the light transmitted through the individual unit cell trains is imaged at 56 within the interior of the wide field static imager 61 to provide optically inactive volumes 59 which are still sufficiently large to permit the fabrication of the cooling channels 69 without any vignetting with the optical beams associated with the 20° scan angle.

FIG. 22 also illustrates how, with the minus one (−1) magnification construction, an incoming wavefront (illustrated by the single line 70 extending across and normal to all of the ray traces in front of all of the entrance pupils 65) becomes offset (as illustrated by the multiple lines 72 normal to the ray traces exiting the individual exit pupils 67) in the multiple segments of the overall composite light beam transmitted through all of the individual unit cell trains 68.

The amount of the offset between adjacent wavefronts depends upon the wavelength of the monochromatic light being transmitted through the microlens arrays. The offsets occur because of the differences 74 in the lengths of the optical paths of the light transmitted through the individual unit cell trains in the arrays as the arrays are scanned at angles other than 0°.

As noted above phase trimming, after the light passes through the exit pupils 67, is required to restore the offset segments to a stepped wavefront with integer waves per step, if it is required to form good diffraction point spread functions in between the aforementioned Eigen angles.

This offset is illustrated in three dimensions in the isometric view of FIG. 23. FIG. 23 is a computer-generated view like FIG. 20, but shows the offset of the individual wavefronts 72 transmitted through the individual exit pupils 67 at a 5° angle of scan as shown in FIG. 13.

FIG. 24 is a view correlated to FIG. 23. FIG. 24 is a computer-generated view like FIG. 21 but shows how the point spread response is distributed into a series of spaced peaks of varying magnitude at the focal plane 47 for the 5° angle of scan shown in FIG. 13 and for monochromatic light of a 4.0 micrometer wavelength. This 5° angle of scan was not substantially an Eigen angle (or in close proximity to an Eigen angle) for the particular 4.0 micrometer wavelength of the monochromatic light transmitted through the arrays.

FIG. 25 is a computer-generated view like FIG. 20 but shows the offsets for the individual wavefronts 72 transmitted through the individual unit cell trains 68 in two 9×9 microlens arrays having the minus one (−1) magnification construction shown in FIG. 10 with a 5° angle of scan (as shown in FIG. 13) and operating with monochromatic light at a wavelength of 3.775 micrometers.

FIG. 26 is a view correlated with FIG. 25. FIG. 26 is a computer-generated view like FIG. 21 but showing the monochromatic diffraction point spread function for the 5° angle of scan shown in FIG. 13 and for the monochromatic light at a wavelength of 3.775 micrometers. This 5° angle of scan was substantially an Eigen angle (or in close proximity to an Eigen angle) for the particular 3.775 micrometer wavelength of the monochromatic light transmitted through the arrays.

FIG. 26 illustrates how a point source can be resolved under these conditions. However, an extended image (over a substantial field of view) is not satisfactorily resolved under these conditions with the minus one (−1) magnification.

A comparison of FIG. 23 and FIG. 24 with the respective FIG. 25 and FIG. 26 shows that the monochromatic system is very sensitive to wavelength with a minus one (−1) magnification. As will be discussed in more detail below with particular reference to FIGS. 31 and 32, a plus one (+1) magnification design will improve image resolution for monochromatic light at Eigen angles for an extended, or substantially extended, FOV. However, for polychromatic light, stepped wavefront correction will be required for a successful imaging system.

Another embodiment of a unit cell train constructed in accordance with the present invention is illustrated in FIGS. 27 and 28.

FIG. 28 is a side-elevation view of a microlens array assembly 43 which incorporates unit cell trains providing plus one (+1) magnification. The embodiment of the microlens array assembly 43 shown in FIGS. 27 and 28 comprises four arrays, arrays 43A, 43B, 43C and 43D, of microlenses (rather than just the two arrays of microlenses shown in the minus one (−1) magnification cell train embodiments of FIGS. 1 and 10).

In FIG. 27 the two arrays 43C and 43D are constructed as back to back arrays and are separated from the respective arrays 43A and 43B by the air spaces 91 and 93. The arrays 43C and 43D are separated by an air space 96.

It should be noted that the two arrays 43C and 43D can be replaced by a single microlens array, to provide the plus one (+1) magnification at the exit pupil, but the design for a plus one (+1) magnification cell train is simpler when using a total of four arrays rather than a total of three arrays.

The unit cell trains produce a first image 56 between the arrays 43A and 43C and produce an internal pupil 95 in the air space 96 between the arrays 43C and 43D. This pupil 95 has negative magnification, in this case minus one (−1).

The unit cell train construction shown in FIG. 27 produces a second image 97 between the arrays 43D and 43B, and the unit cell train produces an exit pupil 67 whose magnification is plus one (+1).

In the FIGS. 27 and 28 embodiment, the back to back arrays 43C and 43D are movable with respect to the outer arrays 43A and 43B to provide scanning. Alternatively array 43B could move, by itself, to produce scanning. For design purposes it is preferable to move the last array 43B rather than both of the internal arrays 43C and 43D.

FIG. 27 shows all of the elements of a unit cell train aligned for a 0° angle of scan.

FIG. 27 traces representative rays through the unit cell train for a 0° field of view.

FIG. 28 is a view like FIG. 27 but traces representative light rays through the unit cell trains for a +5° angle FOV and for a −5° angle FOV.

FIG. 29 is a computer-generated view like FIG. 20 but shows the offset of the individual wavefronts 72 of the individual unit cell trains in a 9×9 array of microlenses for a scan position of 3.0 micrometers. That is, the scanning arrays 43C and 43D were offset 3.0 micrometers from the centerline to produce the computer-generated view shown in FIG. 29.

FIG. 30 is a view correlated to FIG. 29. FIG. 30 is a computer-generated view like FIG. 21 but showing the monochromatic diffraction point spread function corresponding to the offsets in the wavefronts as illustrated in FIG. 29. This particular scanning offset position was not an Eigen position for the particular wavelength of the monochromatic light transmitted through the individual unit cell trains, as shown by the presence of the two peaks.

FIG. 31 is a computer-generated view like FIG. 20 but showing the offsets of the individual wavefronts 72 transmitted through the individual unit cell trains of a 9×9 microlens array having the plus one (+1) magnification unit cell train construction illustrated in FIGS. 27 and 28, but for an offset of the arrays 43 and 43D of 9.5 micrometers.

FIG. 32 is a view correlated to FIG. 31. FIG. 32 is a computer-generated view like FIG. 21 and shows the monochromatic diffraction point spread function for the 9.5 micrometer offset illustrated in FIG. 31. In this case, the 9.5 micrometer offset position of the scanner arrays 43C and 43D was an Eigen position with respect to the wavelength of the monochromatic light transmitted through the four arrays of the FIG. 27 and FIG. 28 embodiment.

This FIG. 32 view illustrates that with a plus one (+1) magnification array of unit cell trains an acceptable point spread response can be achieved at Eigen angle positions. The image quality over a substantially extended FOV is also acceptable at the Eigen angle positions with the plus one (+1) magnification unit cell train, and without the need for phase trimming of monochromatic light.

However, for polychromatic light, as noted above with reference to the comparison of FIGS. 23-24 with FIGS. 25-26, stepped wavefront correction is needed in order to produce an acceptable imaging system for polychromatic light.

FIG. 33 is a view showing another embodiment of the present invention in which a telescope 99 is positioned adjacent the entrance side of the large aperture formed by the microlens array assembly 43.

The telescope 99, as shown in FIG. 33, reduces the diameter of the light beam transmitted through the telescope from the large diameter D at the entrance 101 to the small diameter d at the exit 103 of the telescope.

This enables a smaller size (diameter) of the microlens array assembly 43 to be used for viewing a particular field of regard than would be possible without the telescope. Reducing the size of the microlens array assembly 43 facilitates fabrication of the microlens array assembly 43.

However, the overall distance through which the scanning arrays 43B are moved must be increased, as compared to the distance of movement which would be required without the telescope, in order to scan the same field of regard.

The angle-aperture product must be preserved.

While we have illustrated and described the preferred embodiments of our invention, it is to be understood that these are capable of variation and modification, and we therefore do not wish to be limited to the precise details set forth, but desire to avail ourselves of such changes and alterations as fall within the purview of the following claims.

We claim:

1. A large aperture microlens array apparatus comprising, a first array of microlenses having a plurality of microlenses disposed across the first array, a second array of microlenses having a plurality of microlenses disposed across the second array, unit cell train means comprising a plurality of individual unit cell trains optically interconnecting individual microlenses in the first array with related individual microlenses in the second array so that light entering an entrance pupil of a microlens in one array is transmitted through an exit surface of a related microlens in the other array, the microlenses in the first and second arrays and the unit cell train means being constructed so that the microlens in the one of the arrays images the light entering the entrance pupil and transmits, through a related individual unit cell train, the imaged light to the related microlens in the other array, and the related microlens in the other array receives the imaged light, through the related individual unit cell train, and provides a collimated output through the exit surface so that the individual unit cell trains coact to provide a large aperture for transmitting a beam of light as a composite of the light beam segments transmitted through the individual unit cell trains, and wherein the construction of the microlenses in the first and second arrays provides optically inactive volumes with respect to the individual microlenses in each array which the optically inactive volumes can be used for non-optical functions.

2. The apparatus defined in claim 1 including cooling means in the optically inactive volumes within at least one of the microlens arrays for removing heat.

3. The apparatus defined in claim 1 wherein the first and second microlens arrays are mounted in a static, fixed relationship to one another.

4. A large aperture microlens array apparatus comprising, a first array of microlenses having a plurality of microlenses disposed across the first array, a second array of microlenses having a plurality of microlenses disposed across the second array, unit cell train means comprising a plurality of individual unit cell trains optically interconnecting individual microlenses in the first array with related individual microlenses in the second array so that light entering an entrance pupil of a microlens in one array is transmitted through an exit pupil of a related microlens in the other array, the microlenses in the first and second arrays and the unit cell train means being constructed so that the microlens in the one of the arrays images the light entering the entrance pupil and transmits, through a related individual unit cell train, the imaged light to the related microlens in the other array, and the related microlens in the other array receives the imaged light, through the related individual unit cell train, and provides a collimated output through the exit pupil without vignetting, so that the individual unit cell trains coact to provide a large aperture for transmitting a beam of light as a composite of the light beam segments transmitted through the individual unit cell trains, and wherein the one of the arrays is mounted for dynamic movement with respect to the other array to permit scanning and viewing larger than possible with a static, fixed mounting of the two arrays.

5. The apparatus defined in claim 4 including array positioning and control means for changing the position of the one array with respect to the other array and for controlling an exact position of the one array with respect to the other array.

6. The apparatus defined in claim 5 wherein the beam of light transmitted through the large aperture is monochromatic and wherein the movable array is positioned at a plurality of substantially Eigen positions with respect to the frequency of the monochromatic beam of light.

7. The apparatus defined in claim 4 wherein the large aperture comprises only two arrays of microlenses having four surfaces in an individual unit cell train and provides a minus one (−1) magnification.

8. The apparatus defined in claim 7 wherein the first array comprises individual microlenses which function as wide field static imagers in each related unit cell train and wherein the second array comprises individual microlenses which function as a collimating scanner in each related unit cell train.

9. The apparatus defined in claim 8 wherein the second array is movable over an arc to provide the collimating scanner function.

10. The apparatus defined in claim 8 wherein each unit cell train has a related microlens in the first array which is constructed to form the light entering the entrance pupil of that microlens into an internal image within that microlens.

11. The apparatus defined in claim 8 wherein each unit cell train has a first, front surface which forms the entrance pupil and which is constructed as a general aspheric surface.

12. The apparatus defined in claim 11 wherein the first, general aspheric surface is a rotationally symmetric surface.

13. The apparatus defined in claim 11 wherein the first, general aspheric surface is a nonrotationally symmetric surface for operation at a look angle which is biased with respect to a normal of a surface of the large aperture.

14. The apparatus defined in claim 11 wherein each unit cell train has a second surface and the second surface of each unit cell train is a rear surface of a microlens in the first array and is a general aspheric surface.

15. The apparatus defined in claim 14 wherein each unit cell train includes an air space between the microlenses in the first and second arrays and wherein the second, general aspheric surface of a microlens in the first array renders the air space telecentric and corrects coma in the unit cell train.

16. The apparatus defined in claim 14 wherein each unit cell train has a third surface and the third surface of each unit cell train is an inlet surface on a microlens in the second array and is a conic aspheric surface to form an outlet pupil.

17. The apparatus defined in claim 16 wherein each unit cell train has a fourth, exit pupil outlet surface and the fourth, exit pupil outlet surface on a microlens in the second array is a general aspheric surface which collimates the output, corrects spherical aberration, and functions as the exit pupil at one minus one (−1) magnification.

18. The apparatus defined in claim 4 wherein surfaces which form the entrance pupils in each unit cell train are blazed surfaces for a preferred angle of view.

19. The apparatus defined in claim 4 wherein all of surfaces on microlenses in a unit cell train are refractive surfaces.

20. The apparatus defined in claim 4 wherein at least some of surfaces on microlenses in a unit cell train are diffractive surfaces.

21. The apparatus defined in claim 4 wherein the large aperture comprises more than two arrays of microlenses and provides a plus one (+1) magnification.

22. The apparatus defined in claim 21 wherein each individual unit cell train has three pupils comprising the entrance pupil, the exit pupil and an internal pupil and wherein each unit cell train forms two images.

23. The apparatus defined in claim 21 wherein the large aperture further includes intermediate microlens array means interposed between the outer arrays for providing an internal pupil between the entrance pupil and the exit pupil in each individual cell train and the plus one (+1) magnification at an outlet of the large aperture.

24. The apparatus defined in claim 23 wherein the intermediate microlens array means comprise two arrays of microlens.

25. The apparatus defined in claim 4 wherein the first and second arrays of microlenses are constructed to form an afocal large aperture in which light can be transmitted in either direction through the first and second arrays of microlenses.

26. The apparatus defined in claim 4 including beam shaping means disposed adjacent the exit pupil side of the aperture for shaping the beam of light transmitted through the large aperture.

27. The apparatus defined in claim 26 wherein the beam shaping means include a lens for focusing the beam.

28. The apparatus defined in claim 4 including telescope means adjacent the entrance pupil side of the aperture for reducing the diameter of the beam of light as transmitted through the telescope means to the aperture.

29. The apparatus defined in claim 4 wherein the construction of the microlenses in the arrays provides optically inactive volumes with respect to the individual microlenses in each array which the optically inactive volumes can be used for non-optical functions.

30. The apparatus defined in claim 29 including cooling means in the optically inactive volumes within at least one of the microlens arrays for removing heat.

31. The apparatus defined in claim 4 wherein each microlens in the arrays has a diameter in the range of 0.5 to 2.0 millimeters.

32. The apparatus defined in claim 31 wherein the small diameter of the microlenses in the arrays enables the microlens arrays to survive a relatively high thermal gradient across the arrays.

* * * * *